United States Patent
Pyun et al.

(10) Patent No.: US 9,459,722 B2
(45) Date of Patent: Oct. 4, 2016

(54) DISPLAY APPARATUS AND METHOD OF MANUFACTURING THE SAME

(71) Applicant: Samsung Display Co., Ltd., Yongin (KR)

(72) Inventors: Jaejin Pyun, Hwaseong-si (KR); Jongwon Lee, Seongnam-si (KR); Byoungwon Choi, Pyeongtaek-si (KR); Seungho Nam, Seongnam-si (KR); Seongmo Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/464,812

(22) Filed: Aug. 21, 2014

(65) Prior Publication Data

US 2015/0212634 A1 Jul. 30, 2015

(30) Foreign Application Priority Data

Jan. 28, 2014 (KR) .......................... 10-2014-0010633

(51) Int. Cl.
| | |
|---|---|
| *G06F 3/041* | (2006.01) |
| *G09G 3/36* | (2006.01) |
| *H01L 27/12* | (2006.01) |
| *G06F 3/046* | (2006.01) |
| *G06F 3/0354* | (2013.01) |

(52) U.S. Cl.
CPC ......... *G06F 3/0412* (2013.01); *G06F 3/03545* (2013.01); *G06F 3/046* (2013.01); *G06F 3/0416* (2013.01); *G09G 3/3677* (2013.01); *H01L 27/1259* (2013.01); *G06F 2203/04103* (2013.01); *G09G 2300/0426* (2013.01); *G09G 2354/00* (2013.01)

(58) Field of Classification Search
CPC ............ G06F 3/03545; G06F 3/0412; G06F 3/0416; G06F 3/046; G06F 3/3677; G06F 2203/04103; G09G 2300/0426; G09G 2354/00; H01L 27/1259
USPC ......... 345/173–178; 178/18.01–18.09, 18.11
See application file for complete search history.

(56) References Cited

U.S. PATENT DOCUMENTS

| | | | |
|---|---|---|---|
| 4,878,553 A | 11/1989 | Yamanami et al. | |
| 5,130,500 A * | 7/1992 | Murakami | ............... G06F 3/046 178/18.08 |
| 7,924,269 B2 | 4/2011 | Chen et al. | |

(Continued)

FOREIGN PATENT DOCUMENTS

| | | |
|---|---|---|
| JP | 10-049301 | 2/1998 |
| JP | 2000-076009 | 3/2000 |

(Continued)

*Primary Examiner* — Stephen Sherman
(74) *Attorney, Agent, or Firm* — H.C. Park & Associates, PLC

(57) ABSTRACT

A display apparatus includes a first display substrate, a second display substrate, pixels, a scan line, a sensing line, a first driver, a second driver, and a coordinate calculator. The pixels include pixel rows and pixel columns. The scan line surrounds at least one pixel row of the pixel rows. The sensing line is insulated from the scan line and surrounds at least one pixel column of the pixel columns. The first driver applies a scan signal to the scan line and the second driver outputs a sensing signal provided from the sensing line. The coordinate calculator receives the sensing signal to calculate coordinate information. Each of the scan line and the sensing line is disposed on different layers from each other.

15 Claims, 34 Drawing Sheets

(56) References Cited

U.S. PATENT DOCUMENTS

| | | | |
|---|---|---|---|
| 8,411,059 B2* | 4/2013 | Chen | G06F 3/046 178/18.01 |
| 2006/0164402 A1* | 7/2006 | Tobari | G06F 3/046 345/173 |
| 2009/0167733 A1* | 7/2009 | Lee | H01L 27/1288 345/205 |
| 2010/0110028 A1 | 5/2010 | Takahashi et al. | |
| 2011/0285641 A1 | 11/2011 | Huang | |
| 2015/0042616 A1* | 2/2015 | Takagi | G06F 3/0412 345/174 |

FOREIGN PATENT DOCUMENTS

| | | |
|---|---|---|
| JP | 2006-085490 | 3/2006 |
| JP | 2007-114955 | 5/2007 |
| KR | 10-0499576 | 7/2005 |
| KR | 10-2008-0013262 | 2/2008 |

* cited by examiner

DISPLAY APPARATUS AND METHOD OF MANUFACTURING THE SAME

CROSS-REFERENCE TO RELATED APPLICATION

This application claims priority from and the benefit of Korean Patent Application No. 10-2014-0010633, filed on Jan. 28, 2014, which is hereby incorporated by reference for all purposes as if fully set forth herein.

BACKGROUND

1. Field

Exemplary embodiments of the present invention relate to a display apparatus and a method of manufacturing the same. More particularly, the present disclosure relates to a display apparatus capable of sensing an external input and a method of manufacturing the display apparatus.

2. Discussion of the Background

A touch panel obtains coordinate information of a position at which a touch event occurs (hereinafter, referred to as a "touch position"), and provides information to a display panel. In this manner, the display panel displays an image corresponding to the information provided from the touch panel.

Generally, the touch panel is attached to the display apparatus. In recent years, an input device, such as a keyboard, a mouse, etc., has been replaced with a touch panel. The touch panel may be classified as a resistive film type touch panel, a capacitive type touch panel, or an electromagnetic induction type touch panel. However, the display apparatus may include two or more kinds of touch panels as necessary.

SUMMARY

Exemplary embodiments of the present invention provide a display apparatus capable of reducing a thickness thereof and a method of manufacturing the display apparatus.

Exemplary embodiments of present invention also provide a display apparatus having improved sensing sensitivity and a method of manufacturing the display apparatus. Exemplary embodiments of the inventive concept provide a display apparatus including a first display substrate, a second display substrate, a plurality of pixels, a scan line, a sensing line, a first driver, a second driver, and a coordinate calculator. The first display substrate includes gate lines extending in a first direction, data lines disposed on a layer different from the gate lines and extending in a second direction crossing the first direction, and a first electrode disposed on a layer different from the gate lines and the data lines. The second display substrate faces the first display substrate. The pixels are disposed on the first display substrate and include a plurality of pixel rows and a plurality of pixel columns. The scan line is disposed on the first display substrate or the second display substrate and surrounds at least one pixel row of the pixel rows. The sensing line is disposed on the first display substrate or the second display substrate, insulated from the scan line, and surrounds at least one pixel column of the pixel columns. The first driver applies a scan signal to the scan line to induce a magnetic field by a current path formed by the scan line. The second driver receives a sensing signal from the sensing line, which is generated by a resonant frequency of an input device, and outputs the sensing signal. The coordinate calculator receives the sensing signal to calculate coordinate information of an input position. Each of the scan line and the sensing line is disposed on different layers from each other.

Exemplary embodiments of the inventive concept also provide a method of manufacturing a display apparatus, including forming a gate pattern including a scan base pattern, a sensing base pattern, and a gate line on a first substrate, the scan base pattern, the sensing base pattern, and the gate lines being spaced apart from each other, forming a first insulating layer on the gate pattern to include a first contact hole overlapped with the scan base pattern and a second contact hole overlapped with the sensing base pattern, and forming a data pattern including a scan bridge pattern connected to the scan base pattern through the first contact hole, a sensing bridge pattern connected to the sensing base pattern through the second contact hole, and a data line on the first insulating layer, the scan bridge pattern, the sensing bridge pattern, and the data line being spaced apart from each other. The scan base pattern and the scan bridge pattern form a current path surrounding at least one pixel row, and the sensing base pattern and the sensing bridge pattern form a current path surrounding at least one pixel column.

Exemplary embodiments of the inventive concept also provide a method of manufacturing a display apparatus, including forming a first scan bridge pattern and a first sensing bridge pattern spaced apart from the first scan bridge pattern on a first substrate, forming a first insulating layer including a first contact hole overlapped with the first scan bridge pattern and a second contact hole overlapped with the first sensing bridge pattern, forming a gate pattern including a first scan base pattern connected to the first scan bridge pattern through the first contact hole, a first sensing base pattern connected to the first sensing bridge pattern through the second contact hole, a second sensing bridge pattern, and a gate line on the first insulating layer, the first scan base pattern, the first sensing base pattern, the second sensing bridge pattern, and the gate line being spaced apart from each other, forming a second insulating layer including a third contact hole overlapped with the first scan base pattern, a fourth contact hole overlapped with the first sensing base pattern, and a fifth contact hole overlapped with the first sensing base pattern and spaced apart from the fourth contact hole, forming a data pattern including a second scan base pattern connected to the first scan base pattern through the third contact hole, a second sensing base pattern connected to the first sensing base pattern through the fourth contact hole and connected to the second sensing bridge pattern through the fifth contact hole, and a data line on the second insulating layer, the second scan base pattern, the second sensing base pattern, and the data line being spaced apart from each other, forming a third insulating layer including a sixth contact hole overlapped with the second scan base pattern, and forming a second scan bridge pattern connected to the second scan base pattern through the sixth contact hole and a first electrode on the third insulating layer, the second scan bridge pattern and the first electrode being spaced apart from each other. The first scan base pattern, the second scan base pattern, the first scan bridge pattern, and the second scan bridge pattern form a current path surrounding at least one pixel row, and the first sensing base pattern, the second sensing base pattern, the first sensing bridge pattern, and the second sensing bridge pattern form a current path surrounding at least one pixel column.

Exemplary embodiments of the inventive concept also provide a method of manufacturing a display apparatus, including forming a first display substrate, forming a second display substrate facing the first display substrate, and forming a liquid crystal layer between the first display substrate and the second display substrate. The forming of the first display substrate includes forming a gate pattern including a first scan base pattern and a gate line spaced apart from the first scan base pattern on a first substrate, forming a first insulating layer including a first contact hole overlapped with the scan base pattern and a second contact hole overlapped with the scan base pattern and spaced apart from the first contact hole on the gate pattern, and forming a data pattern including a first scan bridge pattern connected to the first scan base pattern through the first contact hole, a second scan base pattern connected to the first scan base pattern through the second contact hole, and a data line on the first insulating layer, the first scan bridge pattern, the second scan base pattern, and the data line being spaced apart from each other, forming a second insulating layer including a third contact hole overlapped with the second scan base pattern on the data pattern, and forming a second scan bridge pattern connected to the second scan base pattern through the third contact hole and a pixel electrode on the second insulating layer. The first scan base pattern, the second scan base pattern, the first scan bridge pattern, and the second scan bridge pattern form a current path surrounding at least one pixel row.

According to the above, the scan line and the sensing line are formed without additional layer or substrate. Therefore, the thickness of the display panel may be reduced. In addition, the display apparatus may have improved sensing sensitivity against the input device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

The above and other advantages of the present disclosure will become readily apparent by reference to the following detailed description when considered in conjunction with the accompanying drawings.

DETAILED DESCRIPTION OF THE ILLUSTRATED EMBODIMENTS

Figure 1:
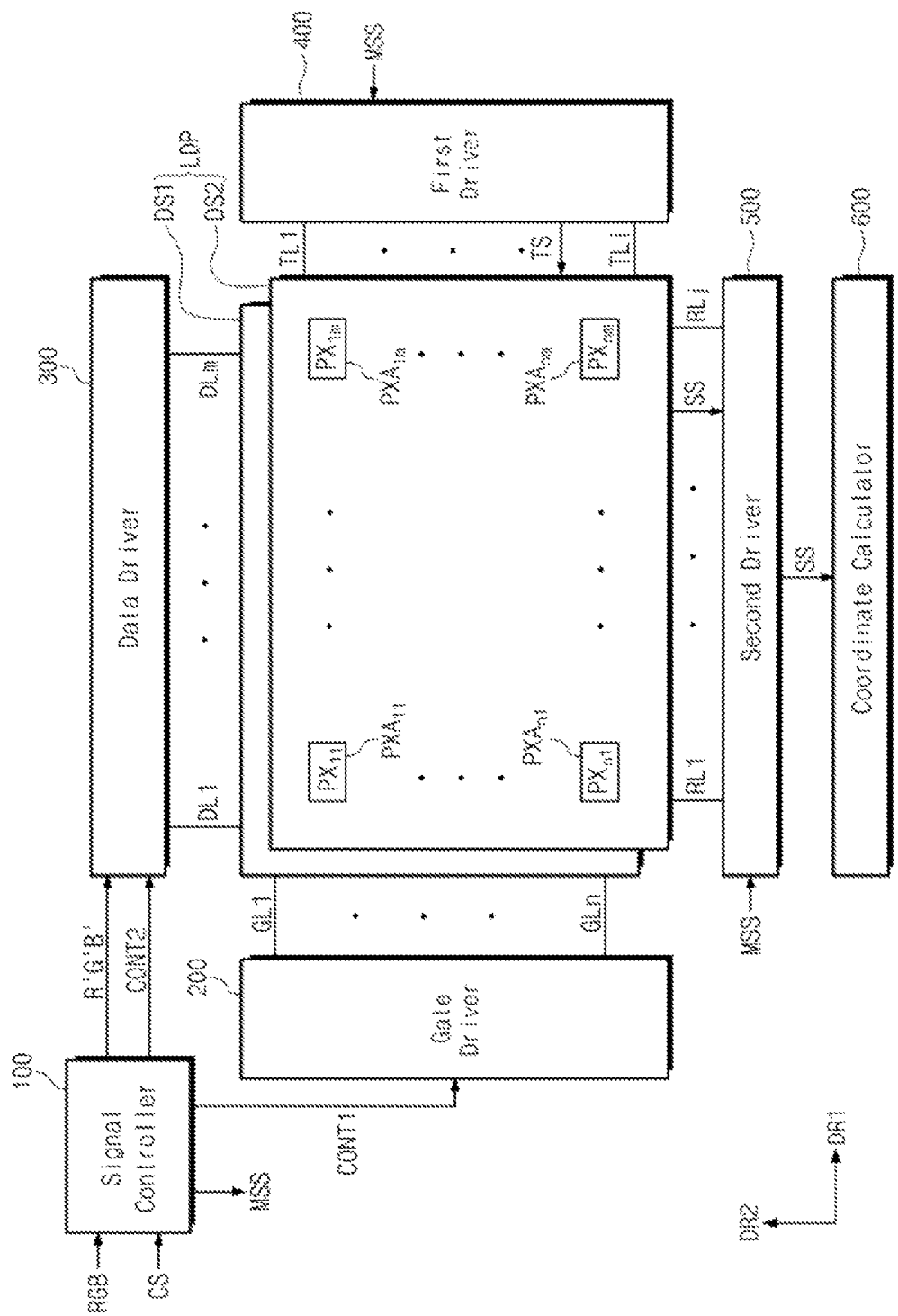
FIG. 1 is a block diagram showing a display apparatus according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a block diagram showing a display apparatus according to an exemplary embodiment of the present disclosure.

Referring to FIG. 1, the display apparatus includes a display panel LDP, a signal controller 100, a gate driver 200, a data driver 300, a first driver 400, a second driver 500, and a coordinate calculator 600. The signal controller 100, the gate driver 200, and the data driver 300 control the display panel LDP to display an image. The first driver 400 and the second driver 500 apply signals to scan lines TL1 to TLi and sensing lines RL1 to RLj or receive signals from the scan lines TL1 to TLi and the sensing lines RL1 to RLj. The coordinate calculator 600 calculates coordinate information of input positions.

The display panel LDP may be of various display panel types, such as a liquid crystal display panel, an organic light emitting display panel, an electrophoretic display panel, an electrowetting display panel, etc. In the present exemplary embodiment, the liquid crystal display panel will be described as the display panel LDP.

A liquid crystal display device further includes a backlight unit (not shown) that provides light to the liquid crystal display panel and a pair of polarizing plate (not shown). The liquid crystal display panel may be a vertical alignment (VA) mode liquid crystal display panel, a patterned vertical alignment (PVA) mode liquid crystal display panel, an in-plane switching (IPS) mode liquid crystal display panel, a fringe-field switching (FFS) mode liquid crystal display panel, or a plane to line switching (PLS) mode liquid crystal display panel. However the liquid crystal display panel type should not be limited thereto or thereby.

The display panel LDP includes a first display substrate DS1, and a second display substrate DS2 spaced apart from the first display substrate DS1. One of the first and second display substrates DS1 and DS2 is disposed at a relatively upper position and provides an input surface of an input device.

The display panel LDP further includes a plurality of pixels PX11 to PXnm, the scan lines TL1 to TLi, the sensing lines RL1 to RLj, gate lines GL1 to GLn, and data lines DL1 to DLm.

The pixels PX11 to PXnm are arranged in a matrix form and disposed to respectively correspond to pixel areas PXA11 to PXAnm. Each of the pixels PX11 to PXnm is connected to a corresponding gate line of the gate lines GL1 to GLn and a corresponding data line of the data lines DL1 to DLm.

The pixels PX11 to PXnm include a plurality of pixel rows, each including the pixels arranged in the first direction DR1, and a plurality of pixel columns, each including the pixels arranged in the second direction DR2. For instance, a first pixel row includes the pixels PX11 to PX1$m$ and a first pixel column includes the pixels PX11 to PXn1.

The scan lines TL1 to TLi and the sensing lines RL1 to RLj are disposed on the first display substrate DS1 or the second display substrate DS2. Each of the scan lines TL1 to TLi may be disposed on different layers and each of the sensing lines RL1 to RLj may be disposed on different layers.

Each of the scan lines TL1 to TLi surrounds at least one pixel row. One end of each of the scan lines TL1 to TLi is connected to the first driver 400. Each of the sensing lines RL1 to RLj is disposed to surround at least one pixel column and one end of each of the sensing lines RL1 to RLj is connected to the second driver 500.

The scan lines TL1 to TLi and the sensing lines RL1 to RLj may include a transparent conductive material. In addition, the scan lines TL1 to TLi and the sensing lines RL1 to RLj may include a metal material having low reflectance.

The gate lines GL1 to GLn and the data lines DL1 to DLm may be disposed on the first display substrate DS1 or the second display substrate DS2.

The gate lines GL1 to GLn extend in the first direction DR1 and are arranged in the second direction DR2. The data lines DL1 to DLm extend in the second direction DR2 and are arranged in the first direction DR1. The data lines DL1 to DLm are insulated from the gate lines GL1 to GLn while crossing the gate lines GL1 to GLn. The gate lines GL1 to GLn are connected to the gate driver 200 and the data lines DL1 to DLm are connected to the data driver 300.

The gate driver 200 and the data driver 300 are disposed on one of the first display substrate DS1, the second display substrate DS2, and a circuit board (not shown). The signal controller 100 and the coordinate calculator 600 are disposed on the circuit board (not shown).

The signal controller 100 receives input image signals RGB and converts the input image signals RGB to image data R'G'B' appropriate to an operation mode of the display panel LDP. In addition, the signal controller 100 receives various control signals CS, e.g., a vertical synchronization signal, a horizontal synchronization signal, a main clock signal, a data enable signal, etc., and outputs first and second control signals CONT1 and CONT2 and a mode selection signal MSS.

The mode selection signal MSS is based on the image displayed on the display panel LDP. The mode selection signal MSS varies in accordance with operation modes. For instance, when the display panel LDP displays a keypad image thereon, the mode selection signal MSS is output as a capacitive activation signal, and when the display panel LDP displays a game image, the mode selection signal MSS is output as an electromagnetic induction activation signal. In addition, the mode selection signal MSS may be input by a user.

The gate driver 200 applies gate signals to the gate lines GL1 to GLn in response to the first control signal CONT1. The first control signal CONT1 includes a vertical start signal to start an operation of the gate driver 200, a gate clock signal to determine an output timing of a gate voltage, and an output enable signal to determine an on-pulse width of the gate voltage.

The data driver 300 receives the second control signal CONT2 and the image data R'G'B'. The data driver 300 converts the image data R'G'B' to data voltages and applies the data voltages to the data lines DL1 to DLm.

The second control signal CONT2 includes a horizontal start signal to start an operation of the data driver 300, an inverting signal to invert a polarity of the data voltages, and an output indicating signal to determine an output timing of the data voltages from the data driver 300.

The first driver 400 receives the mode selection signal MSS. The first driver 400 applies scan signals TS to the scan lines TL1 to TLi in response to the mode selection signal MSS. The magnetic field is induced by the scan signals TS applied along a current path formed by the scan lines TL1 to TLi.

The second driver 500 receives the mode selection signal MSS. The second driver 500 receives sensing signals SS provided from the sensing lines RL1 to RLj, which are obtained from a resonant frequency of the input device. When the input device becomes closer to the scan lines TL1 to TLi, the magnetic field induced by the scan lines TL1 to TLi resonates with a resonant circuit of the input device. Accordingly, the sensing signals SS are output from the sensing lines RL1 to RLj. Here, the input device may be a passive stylus pen including an LC resonant circuit configured to include an inductor and a capacitor.

The coordinate calculator 600 receives the sensing signals SS. The coordinate calculator 600 calculates the coordinate information of the input positions in accordance with the sensing signals SS. Here, the input positions may be positions on the second display substrate DS2, which are touched by the input device or activate when the input device comes in proximity with the second display substrate.

Figure 2:
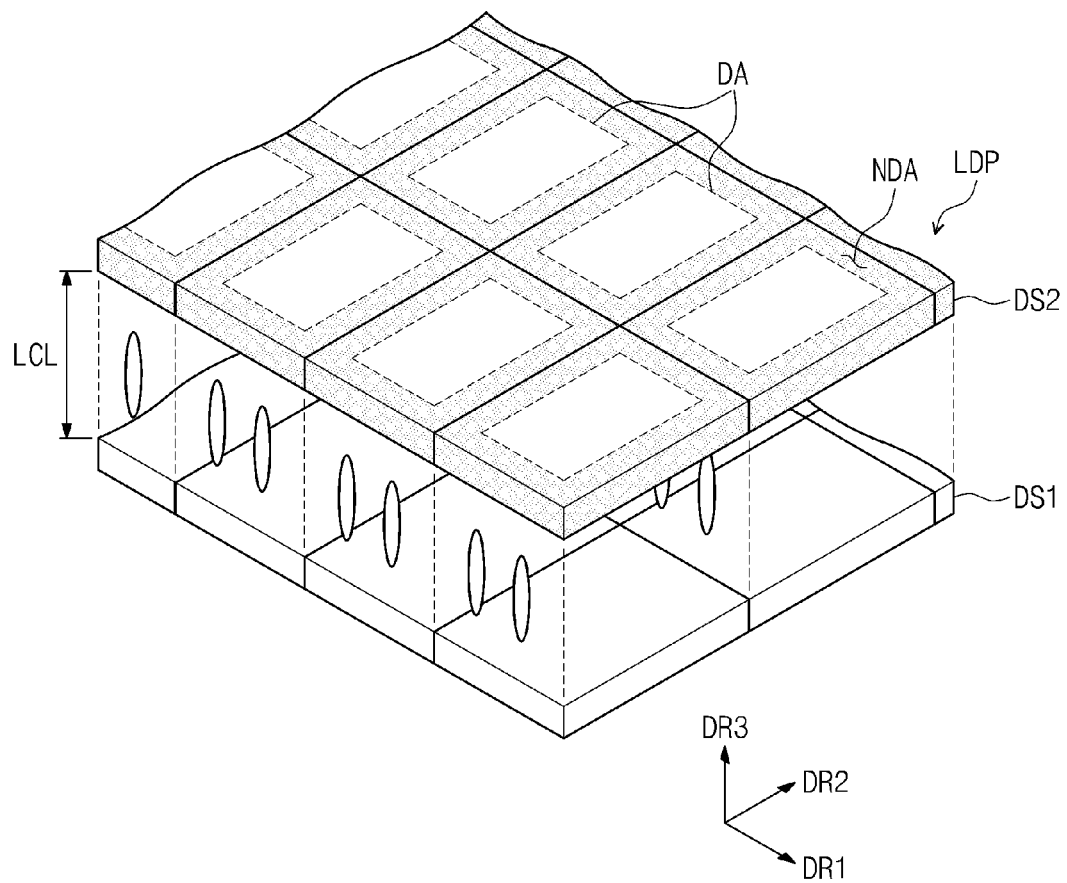
FIG. 2 is a perspective view showing a display panel shown in FIG. 1.
Figure 3:
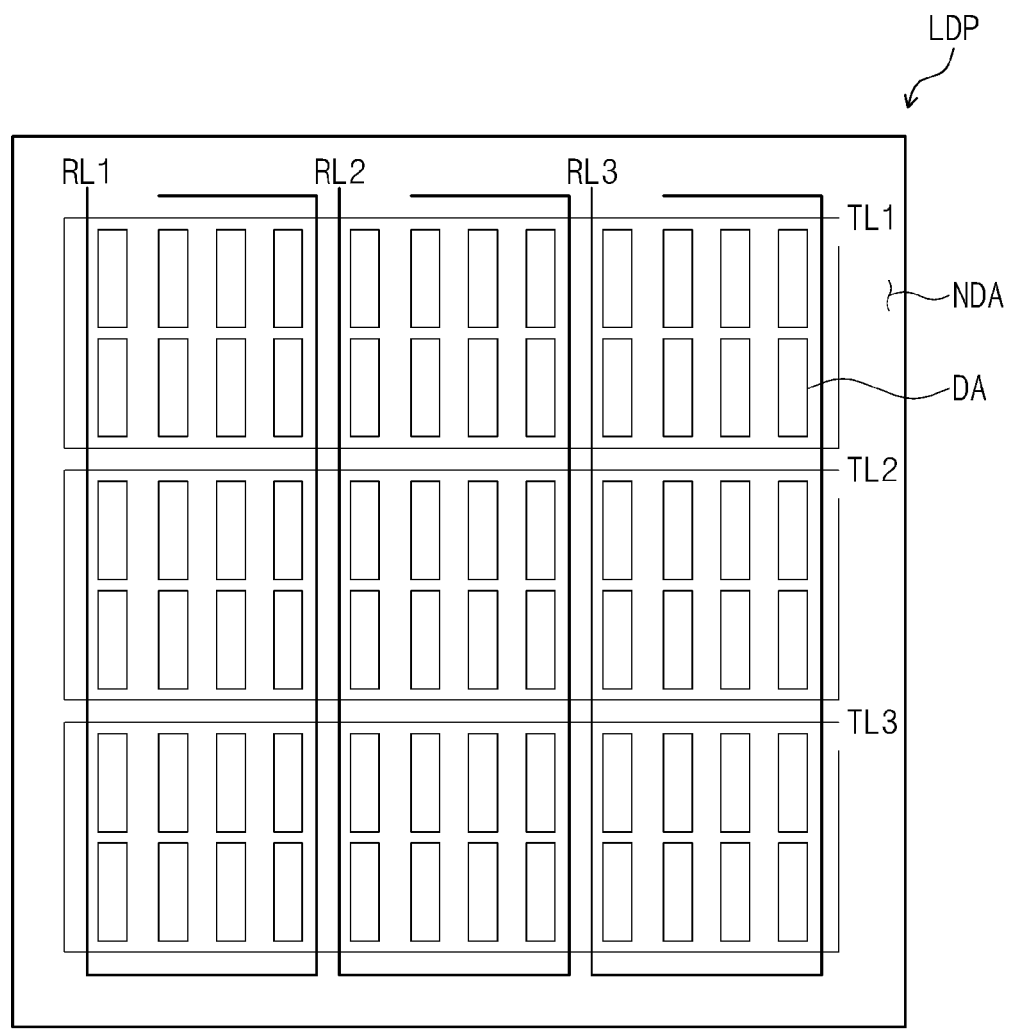
FIG. 3 is a plan view showing the display panel shown in FIG. 2.
Figure 3:
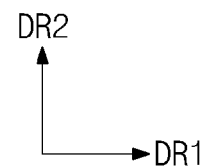

FIG. 2 is a perspective view showing the display panel shown in FIG. 1. FIG. 3 is a plan view showing the display panel shown in FIG. 2.

Referring to FIGS. 2 and 3, the second display substrate DS2 includes a plurality of display areas DA and a non-display area NDA. The display areas DA transmit the light generated by and provided from the backlight unit and the non-display area NDA blocks the light. The display areas DA are arranged in a matrix form. The display apparatus displays the image using the light passing through the display areas DA.

As shown in FIG. 3, the scan lines TL1 to TL3 and the sensing lines RL1 to RL3 are disposed to overlap with the non-display area NDA. FIG. 3 shows three scan lines TL1 to TL3 and three sensing lines RL1 to RL3 as a representative example, but configurations are not limited thereto.

The pixels PX11 to PXnm shown in FIG. 1 are disposed to respectively correspond to the pixel areas DA. Each of the pixels PX11 to PXnm includes a pixel electrode, a common electrode, and a thin film transistor.

Figure 4:
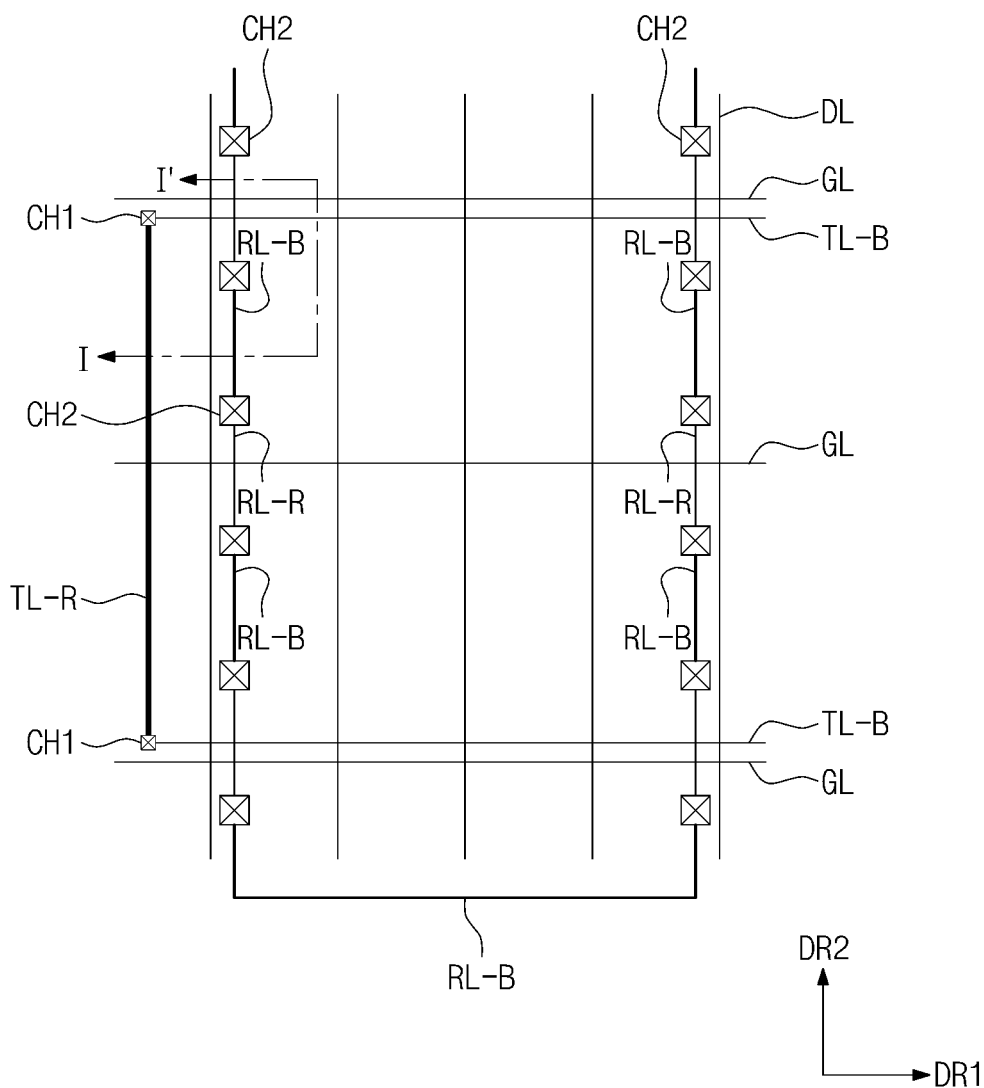
FIG. 4 is a plan view showing a portion of a display panel shown in FIG. 1 according to an exemplary embodiment of the present disclosure.
Figure 5:
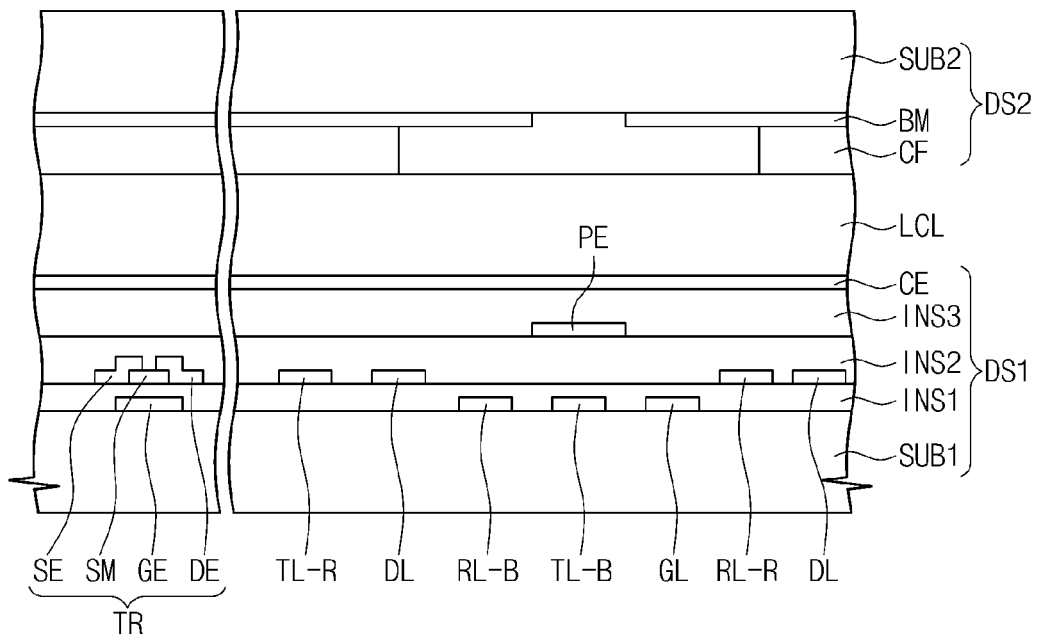
FIG. 5 is a cross-sectional view taken along a line I-I' of the thin film transistor shown in FIG. 4.
Figure 6:
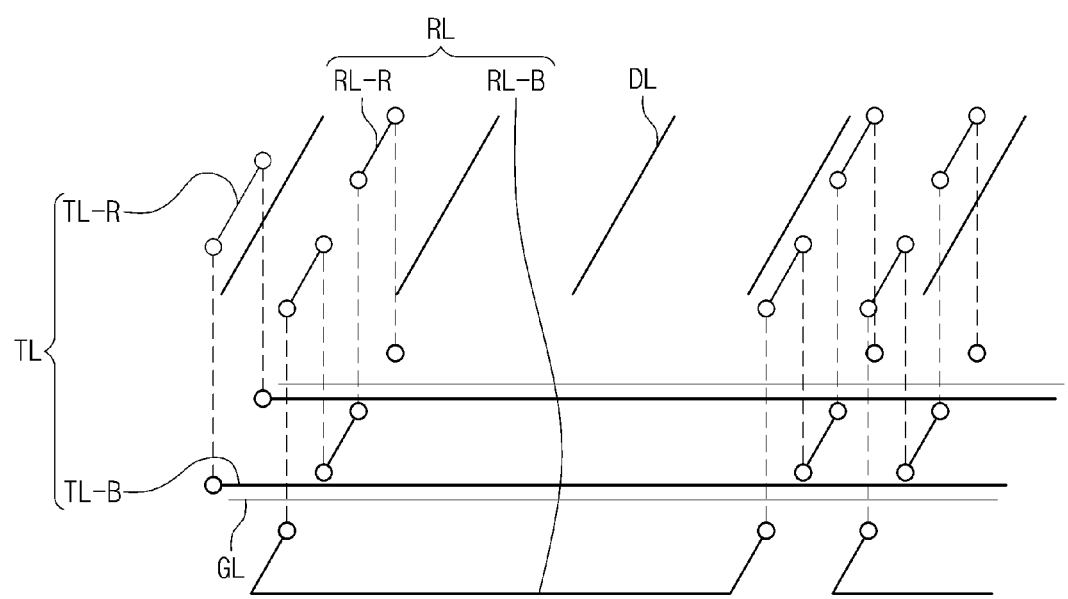
FIG. 6 is a partially exploded perspective view showing a display panel shown in FIG. 1 according to an exemplary embodiment of the present disclosure.

FIG. 4 is a plan view showing a portion of the display panel shown in FIG. 1 according to an exemplary embodiment of the present disclosure. FIG. 5 is a cross-sectional view taken along a line I-I' and a thin film transistor shown in FIG. 4. FIG. 6 is a partially exploded perspective view showing the display panel shown in FIG. 1 according to an exemplary embodiment of the present disclosure.

For the convenience of explanation, FIGS. 4 and 6 show only the scan line TL, the sensing line RL, the gate line GL, and the data line DL.

The thin film transistor TR includes a gate electrode GE, a semiconductor pattern SM, a source electrode SE, and a drain electrode DE. The gate electrode GE is disposed on a first substrate SUB1. A first insulating layer INS1 is disposed between the gate electrode GE and the semiconductor pattern SM. The first insulating layer INS1 is an organic or inorganic insulating layer to insulate the gate electrode GE from the other components. The semiconductor pattern SM is disposed on the first insulating layer INS1 to overlap with the gate electrode GE. The semiconductor pattern SM serves as a channel of the thin film transistor TR. The source electrode SE is connected to the semiconductor pattern SM. Although not shown in figures, the source electrode SE is branched from the data line DL. The drain electrode DE is spaced apart from the source electrode SE and connected to the semiconductor pattern SM. Although not shown in figures, the drain electrode DE is connected to the pixel electrode PE. A second insulating layer INS2 is disposed on the source electrode SE and the drain electrode DE. The second insulating layer INS2 may be an organic or inorganic insulating layer. The drain electrode DE and the pixel electrode PE are connected to each other through a contact hole (not shown) formed through the second insulating layer INS2.

The pixel electrode PE is disposed on the second insulating layer INS2. The pixel electrode PE is formed to correspond to the display areas DA. Although not shown in figures, the pixel PE may include a plurality of slits.

A third insulating layer INS3 is disposed on the pixel electrode PE. The third insulating layer INS3 insulates the pixel electrode PE from the common electrode CE.

The common electrode CE is disposed on the third insulating layer INS3. The common electrode CE is disposed on the entire surface of the second display substrate DS2 and disposed to correspond to the display area DA. Although not shown in figures, the common electrode CE may include a plurality of slits.

The pixel electrode PE receives a pixel voltage through the thin film transistor TR and the common electrode CE receives a common voltage. The pixel electrode PE and the common electrode CE form a horizontal electrical field. The horizontal electric field may change the arrangement of directors included in the liquid crystal layer LCL.

According to another embodiment, the common electrode CE and the pixel electrode PE may be face each other such that the liquid crystal layer LCL is disposed between the common electrode CE and the pixel electrode PE. That is, the common electrode CE may be disposed on the second display substrate DS2 and the pixel electrode PE may be disposed on the first display substrate DS1. In this case, the common electrode CE and the pixel electrode PE may form a vertical electric field.

The display panel further includes a light blocking layer BM and color filters CF. The light blocking layer BM is disposed on a lower surface of the second substrate SUB2. The light blocking layer BM absorbs the light incident thereto. The light blocking layer BM defines the non-display area NDA. In addition, areas in which the light blocking layer BM is not disposed correspond to the display areas DA when viewed in a plan view.

The color filters CF are disposed between the light blocking layer BM and the liquid crystal layer LCL. The color filters CF are disposed to respectively correspond to the display areas DA to assign colors to the light incident thereto. The color filters CF may include red, green, and blue color filters, but are not limited to those colors.

The scan line TL includes a scan base pattern TL-B and a scan bridge pattern TL-R. The sensing line RL includes a sensing base pattern RL-B and a sensing bridge pattern RL-R.

The scan base pattern TL-B is disposed on the same layer as the sensing base pattern RL-B. The scan base pattern TL-B and the sensing base pattern RL-B are disposed on the same layer as the gate line GL.

The scan base pattern TL-B, the sensing base pattern RL-B, and the gate line GL are spaced apart from and insulated from each other.

The scan base pattern TL-B surrounds at least one pixel row, but the scan base pattern TL-B has a disconnected shape in an area in which the scan base pattern TL-B overlaps with the gate line GL. The scan base pattern TL-B has a line shape extending in the first direction DR1. The sensing base pattern RL-B surrounds at least one pixel column, but the sensing base pattern RL-B has a disconnected shape in an area in which the sensing base pattern RL-B is overlapped with the gate line GL. The sensing base pattern RL-B includes a plurality of unit patterns extending in the second direction DR2 and being spaced apart from the gate line GL and the scan base pattern TL-B and a connection pattern extending in the first direction DR1 and connecting two unit patterns spaced apart from each other in the first direction DR1.

The scan bridge pattern TL-R is disposed on the same layer as the sensing bridge pattern RL-R. The scan bridge pattern TL-R and the sensing bridge pattern RL-R are disposed on the same layer as the data line DL. The scan bridge pattern TL-R, the sensing bridge pattern RL-R, and the data line DL are spaced apart from and insulated from each other.

The scan bridge pattern TL-R, the sensing bridge pattern RL-R, and the data line DL extend in the second direction DR2. The scan bridge pattern TL-R and the sensing bridge pattern RL-R are disposed to overlap with the gate line GL.

The scan bridge pattern TL-R connects two scan base patterns spaced apart from each other in the second direction DR2. In detail, the first insulating layer INS1 includes a first contact hole CH1 formed therethrough in an area in which the scan bridge pattern TL-R overlaps with the scan base pattern TL-B. The scan bridge pattern TL-R and the scan base pattern TL-B are connected to each other through the first contact hole CH1.

The sensing bridge pattern RL-R connects two unit patterns spaced apart from each other in the second direction DR2. In detail, the first insulating layer INS1 includes a second contact hole CH2 in an area in which the sensing bridge pattern RL-R is overlapped with the sensing base pattern RL-B, and the sensing bridge pattern RL-R and the sensing base pattern RL-B are connected to each other through the second contact hole CH2.

A portion of the scan line TL and a portion of the sensing line RL are disposed on the same layer as the gate line GL, and the other portion of the scan line TL and the other portion of the sensing line RL are disposed on the same layer as the data line DL. Therefore, additional layer or substrate does not need to form the scan line TL and the sensing line RL, and thus a thickness of the display panel does not become thick.

FIGS. 7A to 7D are plan views showing a manufacturing method of the display apparatus shown in FIGS. 4 to 6.

Figure 7A:
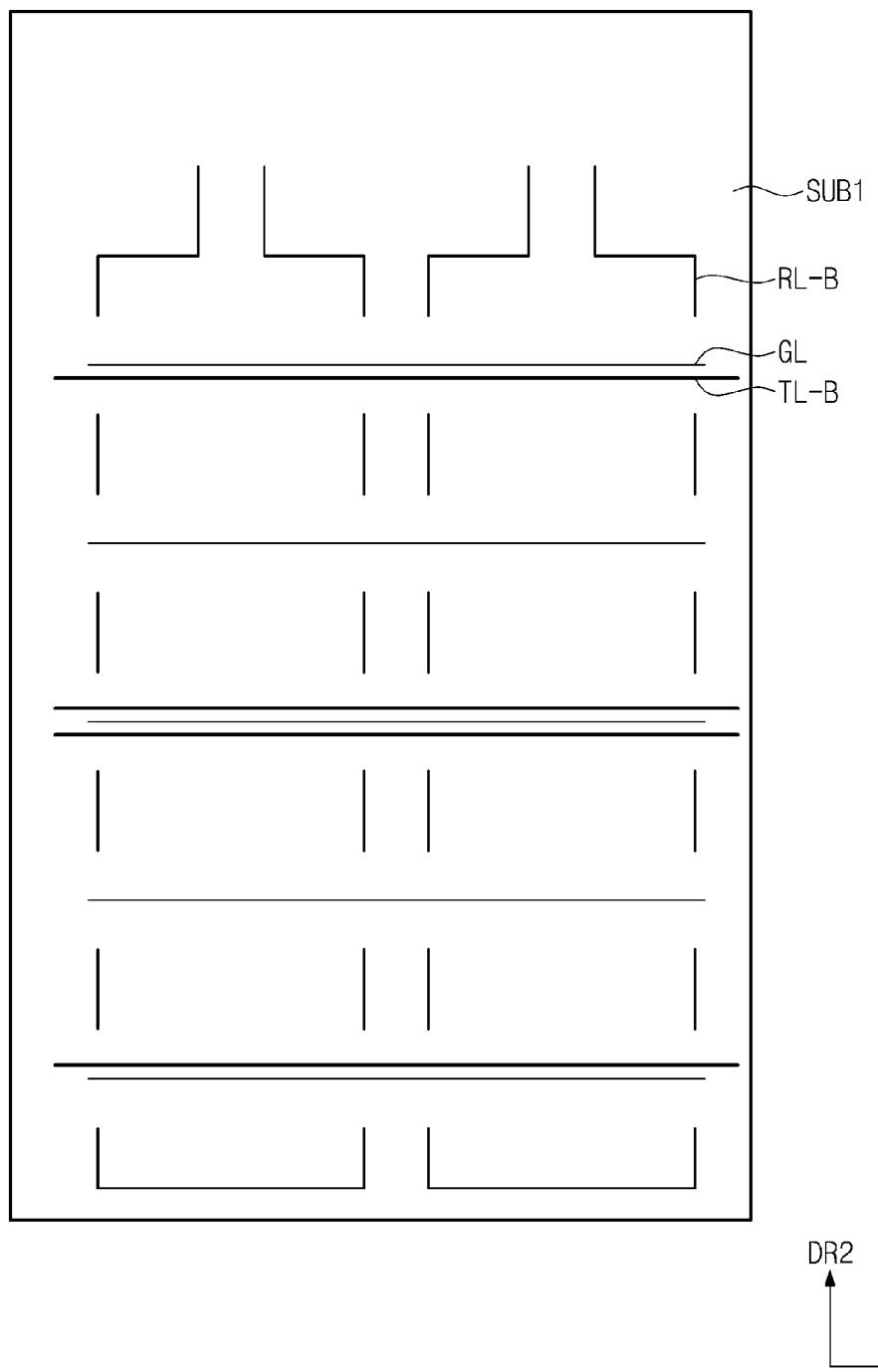
FIGS. 7A, 7B, 7C, and 7D are plan views showing a manufacturing method of the display apparatus shown in FIGS. 4 to 6.

Referring to FIG. 7A, a gate pattern is formed on the first substrate SUB1. The gate pattern includes the scan base pattern TL-B, the sensing base pattern RL-B, and the gate line GL. The scan base pattern TL-B, the sensing base pattern RL-B, and the gate line GL are spaced apart from each other. The gate pattern may further include the gate electrode (not shown).

The gate pattern is formed by depositing a conductive material on the first substrate SUB1 and patterning the conductive material.

The gate line GL extends in the first direction DR1. The scan base pattern TL-B surrounds at least one pixel row, but the scan base pattern TL-B has the disconnected shape in the area in which the scan base pattern TL-B is overlapped with the gate line GL. In FIG. 7A, the scan base pattern TL-B has the line shape extending in the first direction DR1 to be substantially in parallel to the gate line GL. The sensing base pattern RL-B surrounds at least one pixel column, but the sensing base pattern RL-B has a disconnected shape in the area in which the sensing base pattern RL-B is overlapped with the gate line GL.

Figure 7B:
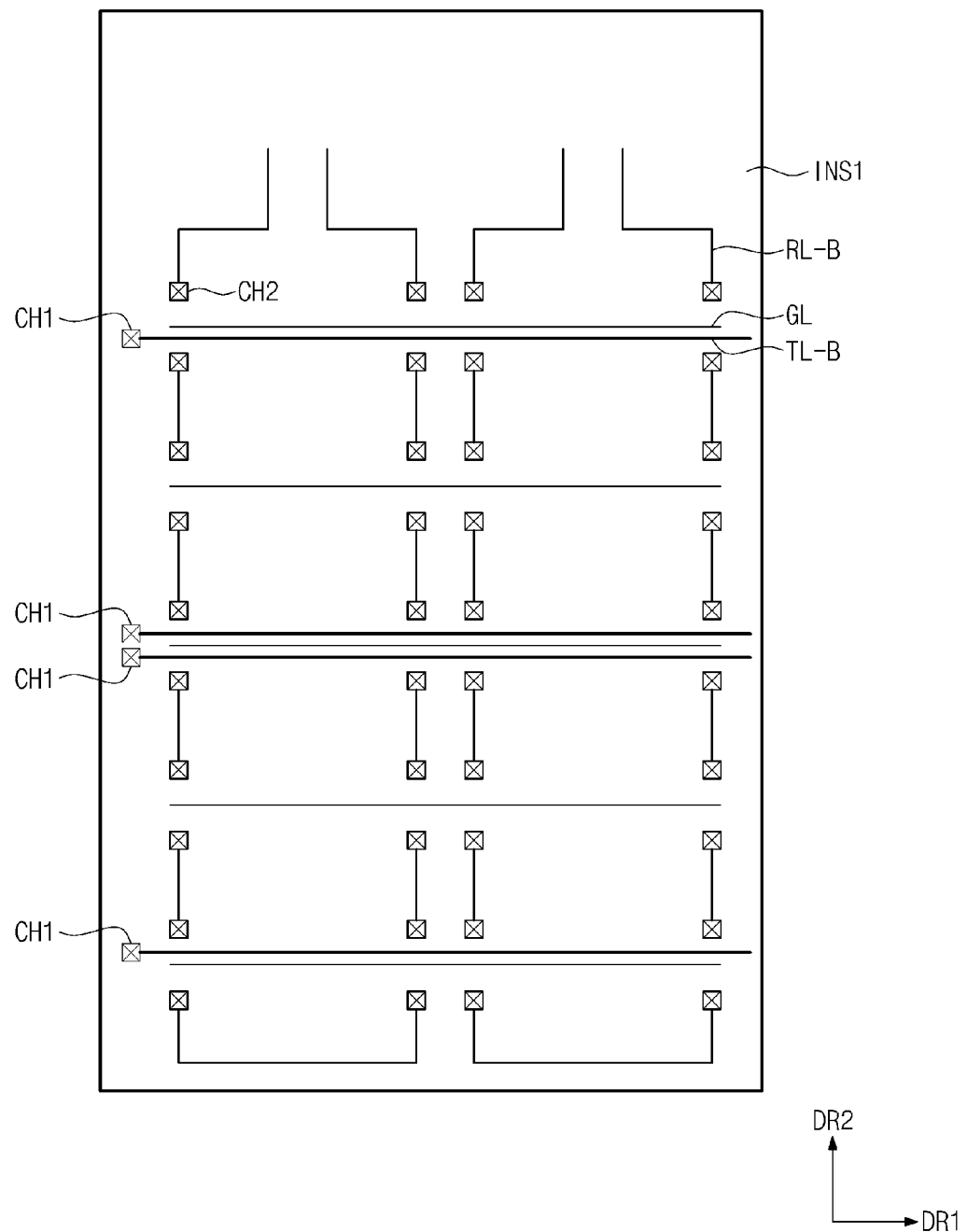

Referring to FIG. 7B, the first insulating layer INS1 is formed on the gate pattern. The first insulating layer INS1 includes the first contact hole CH1 overlapped with the scan base pattern TL-B and the second contact hole CH2 overlapped with the sensing base pattern RL-B.

The first insulating layer INS1 is formed by depositing an organic insulating material and/or an inorganic insulating material on the gate pattern and patterning the organic insulating material and/or an inorganic insulating material.

Figure 7C:
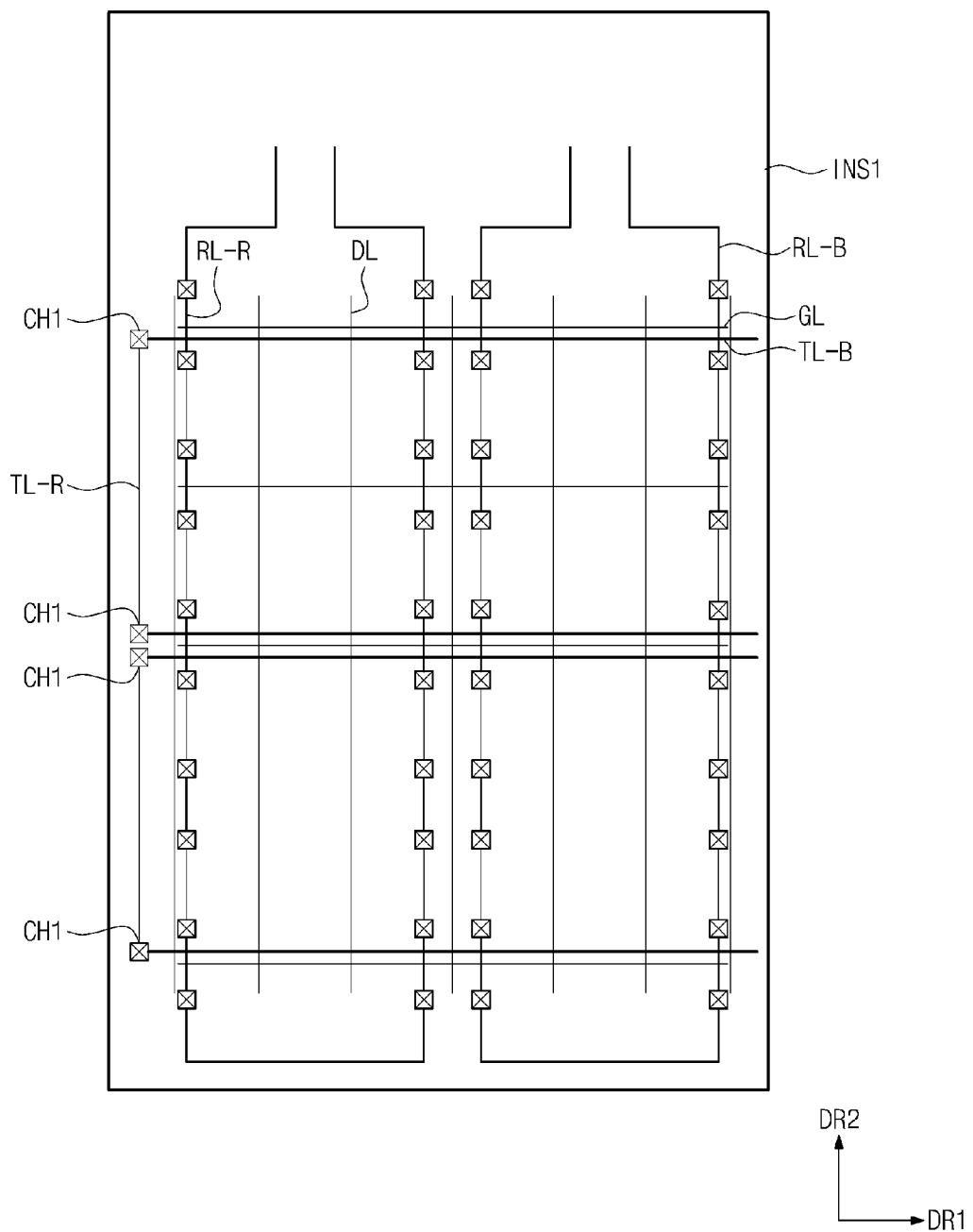

Referring to FIG. 7C, a data pattern is formed on the first insulating layer INS1. The data pattern includes the scan bridge pattern TL-R, the sensing bridge pattern RL-R, and the data line DL. The scan bridge pattern TL-R, the sensing bridge pattern RL-R, and the data line DL are spaced apart from each other. The scan bridge pattern TL-R is connected to the scan base pattern TL-B through the first contact hole CH1. The sensing bridge pattern RL-R is connected to the sensing base pattern RL-B through the second contact hole CH2. The data pattern may further include the source electrode (not shown) and the drain electrode (not shown).

The data line DL extends in the second direction DR2 crossing the first direction DR1. The scan bridge pattern TL-R and the sensing bridge pattern RL-R have the line shape extending in the second direction DR2. The scan bridge pattern TL-R and the sensing bridge pattern RL-R are disposed to cross the gate line GL.

The semiconductor pattern (not shown) may be formed on the first insulating layer INS1 before the data pattern is formed. The semiconductor pattern (not shown) is formed to overlap with the gate electrode (not shown) by depositing a semiconductor material and patterning the semiconductor material.

The data pattern is formed by depositing a conductive material on the first insulating layer INS1 and patterning the conductive material.

The scan base pattern TL-B and the scan bridge pattern TL-R form the current path surrounding at least one pixel row. The sensing base pattern RL-B and the sensing bridge pattern RL-R form the current path surrounding at least one pixel column.

Then, the second insulating layer INS2 is formed on the data pattern. The second insulating layer INS2 includes a contact hole (not shown) formed therethrough to expose a portion of the drain electrode (not shown). The second insulating layer INS2 is formed by depositing an organic insulating material and/or an inorganic insulating material and patterning the organic insulating material and/or the inorganic insulating material.

Figure 7D:
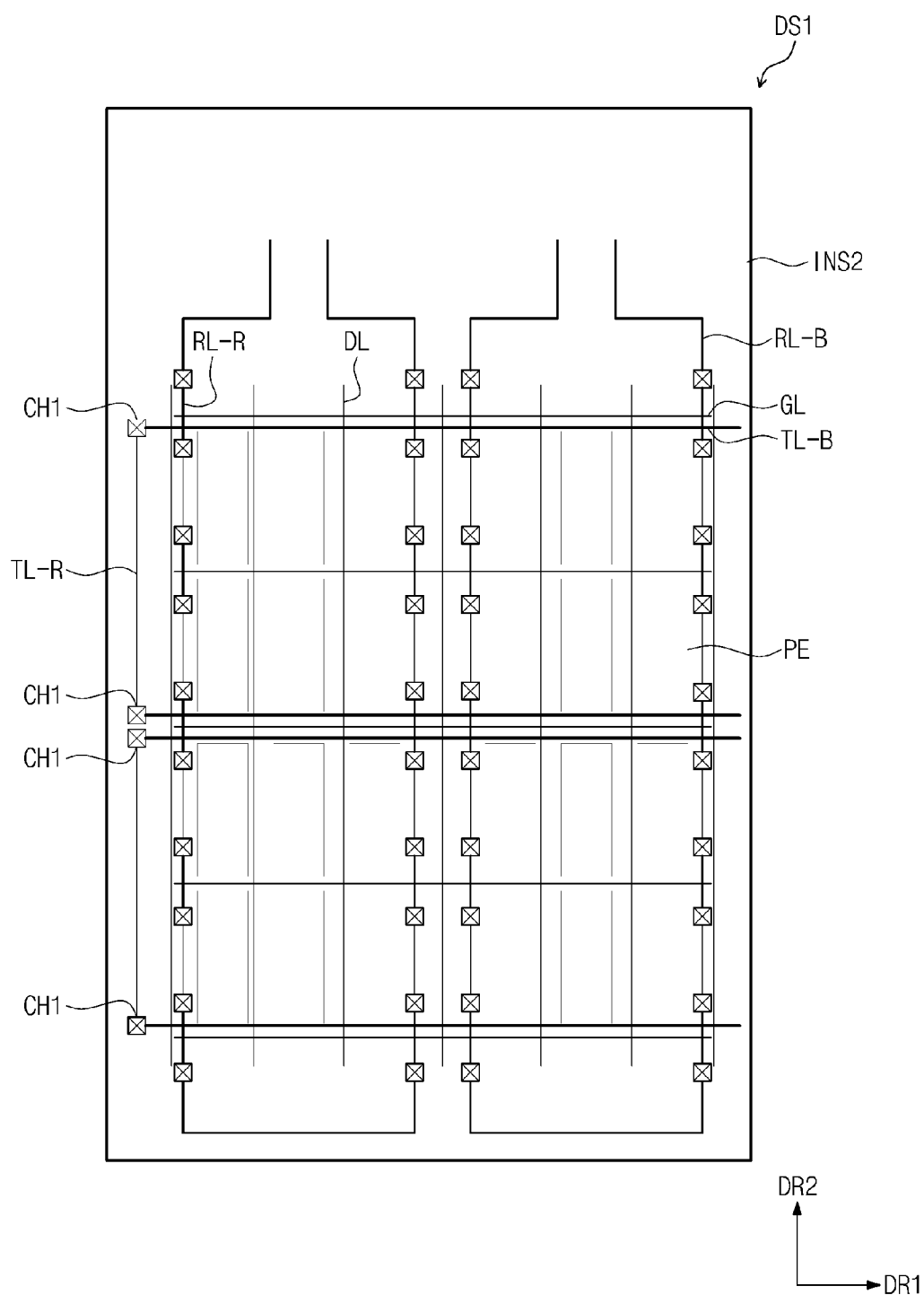

Referring to FIG. 7D, the pixel electrode PE is formed on the second insulating layer INS2. The pixel electrode PE is connected to the drain electrode (not shown) through the contact hole (not shown) formed through the second insulating layer INS2 to expose a portion of the drain electrode (not shown).

Then, the third insulating layer is formed on the pixel electrode PE and the common electrode is formed on the third insulating layer.

Accordingly, the first display substrate DS1 of the display apparatus is formed.

After that, the light blocking layer (not shown) is formed on the second substrate. The color filters (not shown) are formed on the light blocking layer (not shown). Therefore, the second display substrate of the display apparatus is formed.

The liquid crystal layer LCL is formed between the first and second display substrates DS1 and DS2 and sealed.

According to the above-mentioned manufacturing method of the display apparatus, the scan line and the sensing line may be formed by the processes applied to form the gate pattern and the data pattern. Thus, no additional process is required to form the scan line and the sensing line, so that a manufacturing cost of the display apparatus is reduced.

Figure 8:
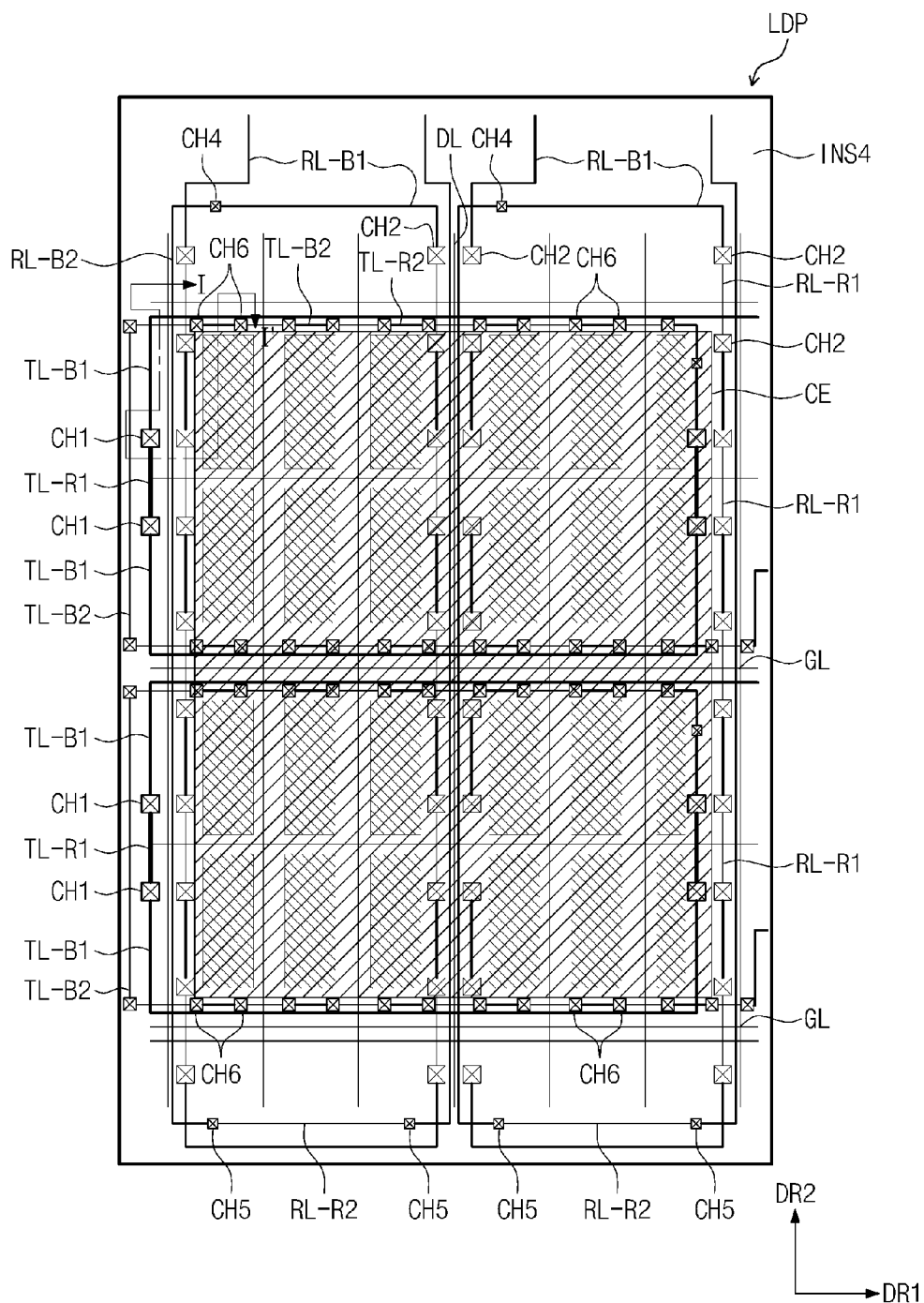
FIG. 8 is a plan view showing a portion of a display panel according to another exemplary embodiment of the present disclosure.
Figure 9:
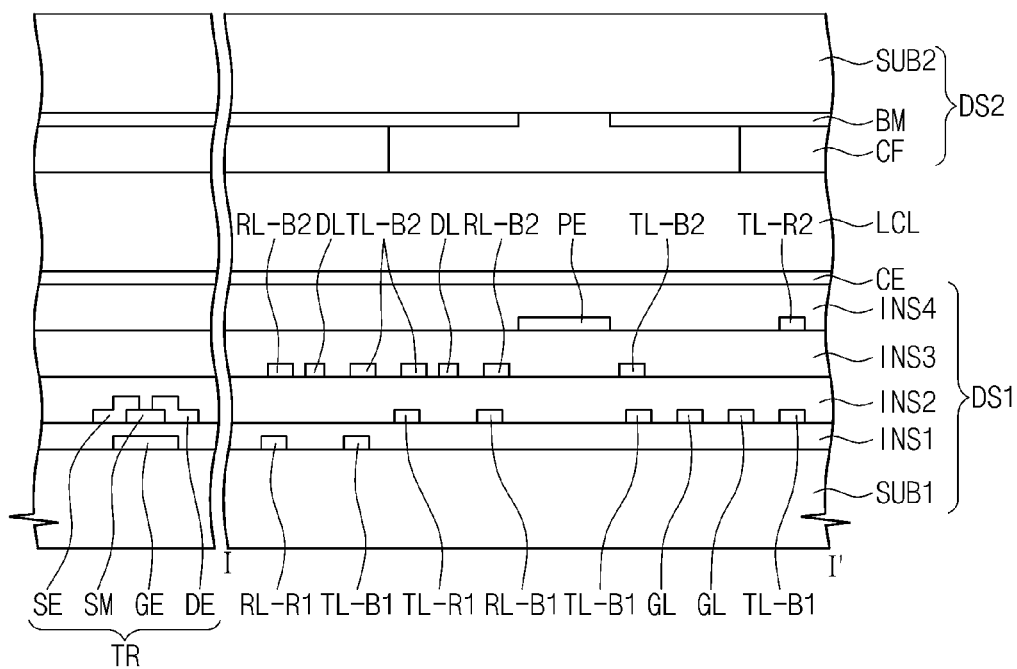
FIG. 9 is a cross-sectional view taken along a line I-I' of the thin film transistor shown in FIG. 8.
Figure 10:
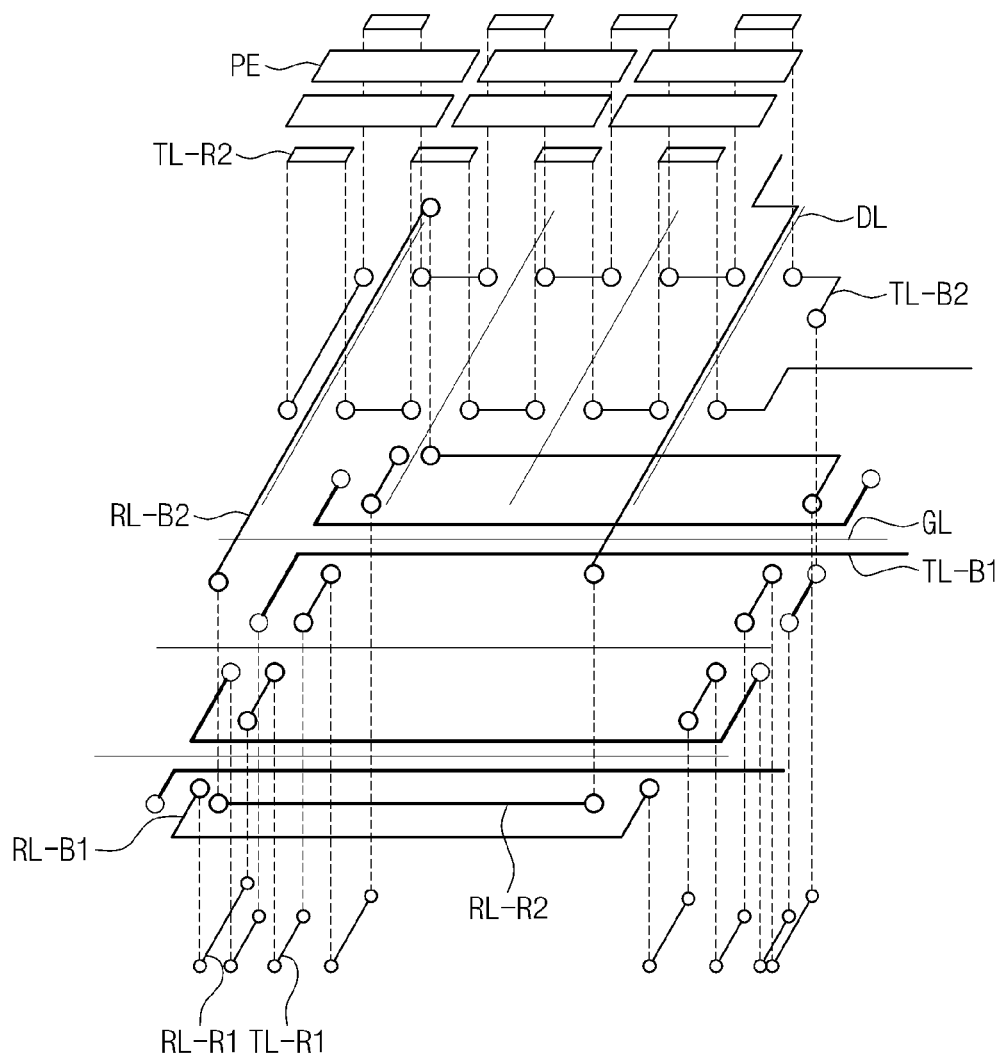
FIG. 10 is a perspective view showing a portion of a display panel according to another exemplary embodiment of the present disclosure.

FIG. 8 is a plan view showing a portion of a display panel according to another exemplary embodiment of the present disclosure, FIG. 9 is a cross-sectional view taken along a line I-I' and a thin film transistor shown in FIG. 8, and FIG. 10 is a perspective view showing a portion of a display panel according to another exemplary embodiment of the present disclosure.

For the convenience of explanation, FIGS. 8 and 10 show only a scan line TL, a sensing line RL, a gate line GL, and a data line DL, and other components are omitted.

Descriptions on the display panel according to another exemplary embodiment will be focused on difference portions from those of the display panel shown in FIGS. 4 to 6.

A first insulating layer INS1 is disposed on the first substrate SUB1. The gate electrode GE is disposed on the first substrate SUB1. A first insulating layer INS1 is disposed on the gate electrode GE. A semiconductor pattern SM, a source electrode SE, and a drain electrode DE are disposed on the first insulating layer INS1. A second insulating layer INS2 is disposed on the semiconductor pattern SM, the source electrode SE, and the drain electrode DE.

The scan line TL includes a first scan bridge pattern TL-R1, a first scan base pattern TL-B1, a second scan base pattern TL-B2, and a second scan bridge pattern TL-R2. The sensing line includes a first sensing bridge pattern RL-R1, a first sensing base pattern RL-B1, a second sensing base pattern RL-B2, and a second sensing bridge pattern RL-R2.

The first scan bridge pattern TL-R1 and the first sensing bridge pattern RL-R1 are disposed on different layers. The first scan bridge pattern TL-R1 is disposed on first insulating layer INS1 and the first sensing bridge pattern RL-R1 is disposed on the first substrate SUB1. The first scan bridge pattern TL-R1 and the first sensing bridge pattern RL-R1 are spaced apart from and insulated from each other.

The first scan bridge pattern TL-R1 and the first sensing bridge pattern RL-R1 have the line shape extending in the second direction DR2. The first scan bridge pattern TL-R1 and the first sensing bridge pattern RL-R1 are disposed to cross the gate line GL.

The first scan base pattern TL-B1 is disposed on the same layer as the first sensing base pattern RL-B1. The first scan base pattern TL-B1 and the first sensing base pattern RL-B1 are disposed on the same layer as the gate line GL.

The first scan base pattern TL-B1, the first sensing base pattern RL-B1, and the gate line GL are spaced apart from and insulated from each other.

The first scan base pattern TL-B1 surrounds at least one pixel row, but the first scan base pattern TL-B1 has the disconnected shape in the area in which the first scan base pattern TL-B1 is overlapped with the gate line GL. In addition, the first sensing base pattern RL-B1 surrounds at least one pixel column, but the first sensing base pattern RL-B1 has the disconnected shape in the area in which the first sensing base pattern RL-B1 overlaps the gate line GL.

The first scan bridge pattern TL-R1 and the first scan base pattern TL-B1 are connected to each other. In detail, the first insulating layer INS1 includes a first contact hole CH1 formed therethrough in an area in which the first scan bridge pattern TL-R1 and the first scan base pattern TL-B1 overlap each other. Therefore, the first scan bridge pattern TL-R1 and the first scan base pattern TL-B1 are connected to each other through the first contact hole CH1.

The first sensing bridge pattern RL-R1 and the first sensing base pattern RL-B1 are connected to each other. In detail, the first insulating layer INS1 includes a second contact hole CH2 formed therethrough in an area in which the first sensing bridge pattern RL-R1 and the first sensing base pattern RL-B1 overlap each other. Thus, the first sensing bridge pattern RL-R 1 and the first sensing base pattern RL-B1 are connected to each other through the second contact hole CH2.

The first scan bridge pattern TL-R1 and the first scan base pattern TL-B1 form a current path surrounding at least one pixel row. The first sensing bridge pattern RL-R1 and the first sensing base pattern RL-B1 form a current path surrounding at least one pixel column.

The second sensing bridge pattern RL-R2 is disposed on a different layer from the first scan base pattern TL-B1 and the first sensing base pattern RL-B1. The second sensing bridge pattern RL-R2 is disposed on a different layer as the gate line GL.

The second sensing bridge pattern RL-R2 is spaced apart from and insulated from the first scan base pattern TL-B1, the first sensing base pattern RL-B1, and the gate line GL. The second sensing bridge pattern RL-R2 has a line shape extending in the second direction DR2. The second sensing bridge pattern RL-R2 crosses the gate line GL.

The second scan base pattern TL-B2 is disposed on the same layer as the second sensing base pattern RL-B2. The second scan base pattern TL-B2 and the second sensing base pattern RL-B2 are disposed on the same layer as the data line DL.

The second scan base pattern TL-B2, the second sensing base pattern RL-B2, and the data line DL are spaced apart from and insulated from each other.

The second scan base pattern TL-B2 surrounds at least one pixel row, but the second scan base pattern TL-B2 has the disconnected shape in the area in which the second scan base pattern TL-B2 overlaps the data line DL. In addition, the second sensing base pattern RL-B2 surrounds at least one pixel column, but the second sensing base pattern RL-B2 has the disconnected shape in the area in which the second sensing base pattern RL-B2 overlaps the data line DL.

The second scan base pattern TL-B2 and the first scan base pattern TL-B1 are connected to each other. In detail, the second insulating layer INS2 includes a third contact hole CH3 formed through an area in which a position where the current path formed by the first scan base pattern TL-B1 and the first scan bridge pattern TL-R1 is ended is overlapped with the second scan base pattern TL-B2. The first scan base pattern TL-B1 is connected to the second scan base pattern TL-B2 through the third contact hole CH3.

The second sensing base pattern RL-B2 and the first sensing base pattern RL-B1 are connected to each other. In detail, the second insulating layer INS2 includes a fourth contact hole CH4 formed through an area in which a position where the current path formed by the first sensing base pattern RL-B1 and the first sensing bridge pattern RL-R1 is ended is overlapped with the second sensing base pattern RL-B2. The first sensing base pattern RL-B1 is connected to the second sensing base pattern RL-B2 through the fourth contact hole CH4.

A third insulating layer INS3 is disposed on the second scan base pattern TL-B2, the second sensing base pattern RL-B2, and the data line DL.

The pixel electrode PE is disposed on the third insulating layer INS3.

The second scan bridge pattern TL-R2 is disposed on the same layer as the pixel electrode PE. The second scan bridge pattern TL-R2 may include the same material as that of the pixel electrode PE, but it should not be limited thereto or thereby. That is, if the positions of the pixel electrode PE and the common electrode CE are changed with respect to each other, the second scan bridge pattern TL-R2 may be disposed on the same layer as the common electrode.

The second scan bridge pattern TL-R2 and the pixel electrode PE are spaced apart from and insulated from each other. The second scan bridge pattern TL-R2 has the line shape extending in the first direction DR1. The second scan bridge pattern TL-R2 is disposed to cross the data line DL.

The second sensing bridge pattern RL-R2 and the second sensing base pattern RL-B2 are connected to each other. In detail, the second insulating layer INS2 includes a fifth contact hole CH5 formed therethrough in an area in which the second sensing bridge pattern RL-R 2 is overlapped with the second sensing base pattern RL-B2, and thus the second sensing bridge pattern RL-R2 is connected to the second sensing base pattern TL-B2 through the fifth contact hole CH5.

The position of the second sensing bridge pattern RL-R2 should not be limited thereto or thereby. According to another embodiment, the second sensing bridge pattern RL-R2 may be disposed on the same layer as the second scan bridge pattern TL-R2. In this case, the second sensing bridge pattern RL-R2 is spaced apart from the second scan bridge pattern TL-R2 and connected to the second sensing base pattern RL-B2 through a contact hole formed through the third insulating layer INS3.

The second scan bridge pattern TL-R2 and the second scan base pattern TL-B2 are connected to each other. In detail, the third insulating layer INS3 includes a sixth contact hole CH6 formed therethrough in an area in which the second scan bridge pattern TL-R2 and the second scan base pattern TL-B2 are overlapped with each other, and the second scan bridge pattern TL-R2 is connected to the second scan base pattern TL-B2 through the sixth contact hole CH6.

A fourth insulating layer INS4 is disposed on the pixel electrode PE and the second scan bridge pattern TL-R2. The pixel electrode PE is insulated from the common electrode CE by the fourth insulating layer INS4. The common electrode CE is disposed on the fourth insulating layer INS4.

The second scan bridge pattern TL-R2 and the second scan base pattern TL-B2 form a current path surrounding at least one pixel row. The second sensing bridge pattern RL-R 2 and the second sensing base pattern RL-B2 form a current path surrounding at least one pixel column.

According to the display apparatus show in FIGS. 8 to 10, the scan line TL forms the current path surrounding at least one pixel row two times, and thus a magnetic field greater than that of the display apparatus shown in FIGS. 4 to 6 may be induced. Consequently, the sensing sensitivity with respect to the input device may be improved. In addition, since the sensing line RL forms the current path surrounding at least one pixel column two times, it is advantageous to sense the sensing signal induced from the resonance of the input device when compared to that of the display apparatus shown in FIGS. 4 to 6. As a result, the sensing sensitivity with respect to the input device may be improved.

FIGS. 11A to 11H are plan views showing a manufacturing method of the display apparatus shown in FIGS. 8 to 10.

Figure 11A:
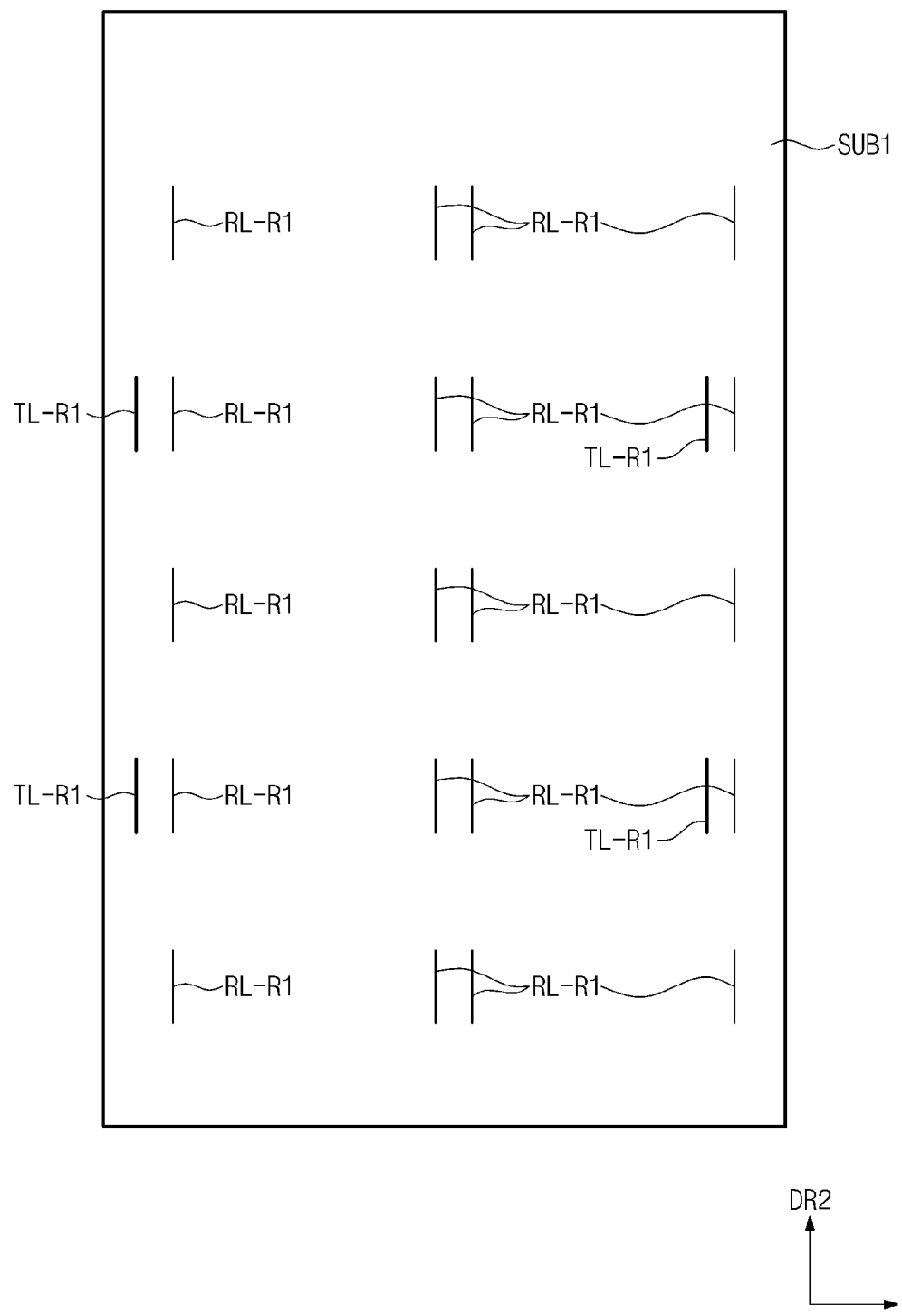
FIGS. 11A, 11B, 11C, 11D, 11E, 11F, 11G, and 11H are plan views showing a manufacturing method of the display panel shown in FIGS. 8 to 10.

Referring to FIG. 11A, the first scan bridge pattern TL-R1 and the first sensing bridge pattern RL-R1 are formed on the first substrate SUB1. The first scan bridge pattern TL-R1 and the first sensing bridge pattern RL-R1 are spaced apart from each other.

The first scan bridge pattern TL-R1 and the first sensing bridge pattern RL-R1 may be formed by deposition a conductive material on the first substrate SUB1 and patterning the conductive material. The first scan bridge pattern TL-R1 has a shape corresponding to a disconnected area of the first scan base pattern TL-B1. The first sensing bridge pattern RL-R1 has a shape corresponding to a disconnected area of the first sensing base pattern RL-B1. The first scan bridge pattern TL-R1 and the first sensing bridge pattern RL-R1 have a line shape extending in the second direction DR2. The first scan bridge pattern TL-R1 and the first sensing bridge pattern RL-R1 may be disposed to cross the gate line GL.

Figure 11B:
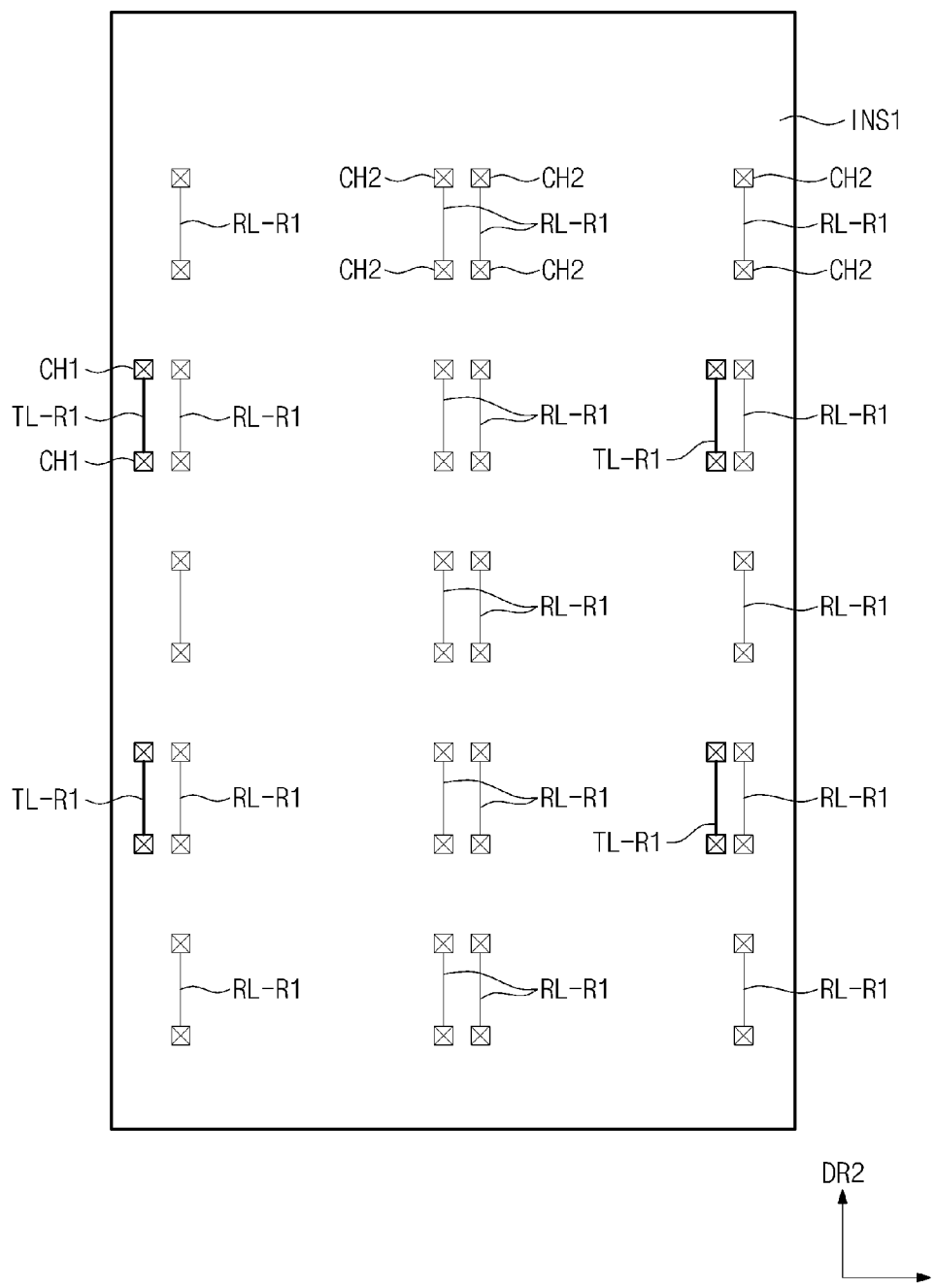

Referring to FIG. 11B, the first insulating layer INS1 is formed on the first scan bridge pattern TL-R1 and the first sensing bridge pattern RL-R1. The first insulating layer INS1 includes the first contact hole CH1 formed therethrough to overlap with an end portion of the first scan bridge pattern TL-R1 and the second contact hole CH2 formed therethrough to overlap with an end portion of the first sensing bridge pattern RL-R1.

The first insulating layer INS1 may be formed by depositing an organic insulating material and/or an inorganic insulating material on the first substrate SUB1, on which the first scan bridge pattern TL-R1 and the first sensing bridge pattern RL-R1 are formed, and patterning the organic insulating material and/or the inorganic insulating material.

Figure 11C:
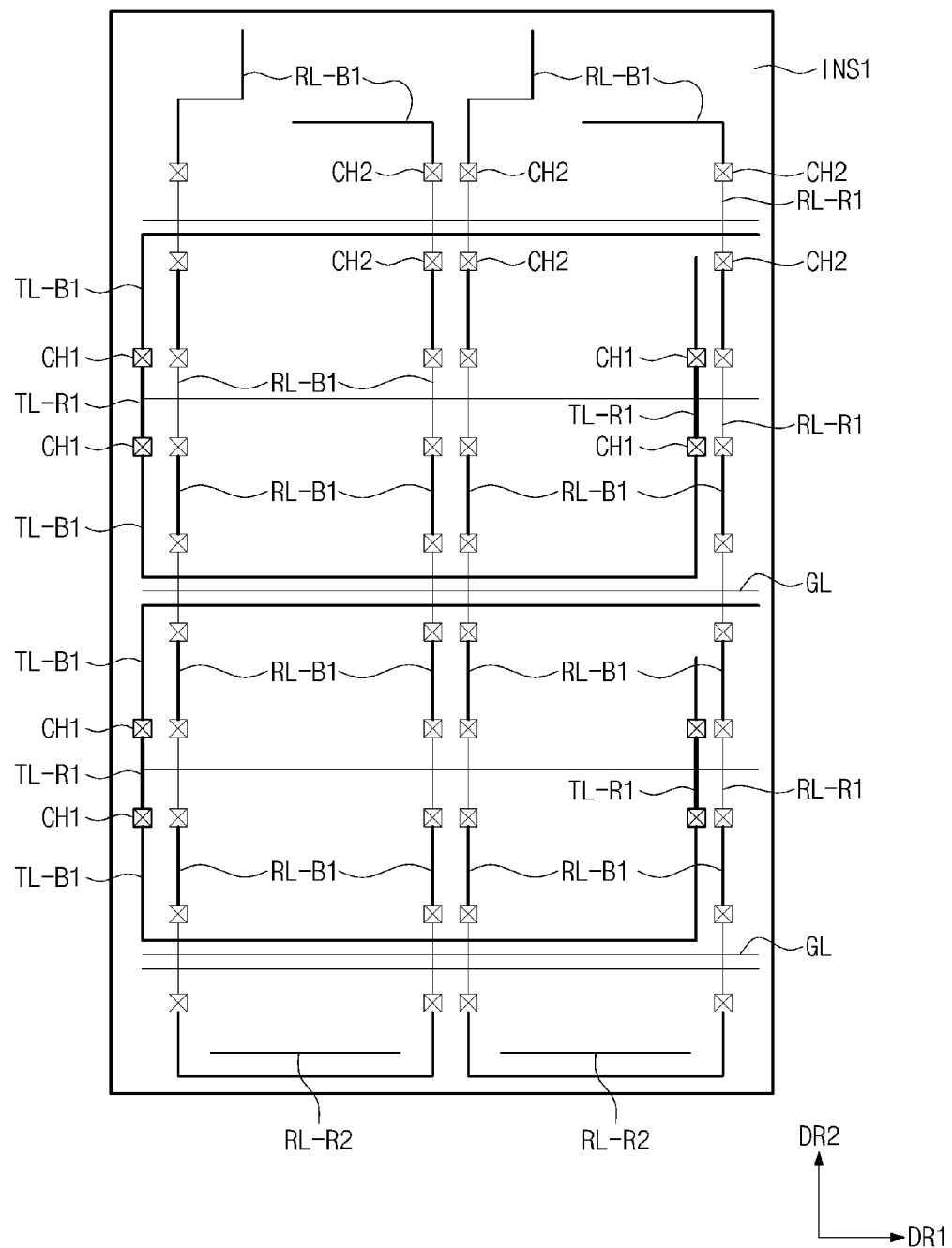

Referring to FIG. 11C, a gate pattern is formed on the first insulating layer INS1. The gate pattern includes the first scan base pattern TL-B1, the first sensing base pattern RL-B1, the second sensing bridge pattern RL-R2, and the gate line GL. The first scan base pattern TL-B1, the first sensing base pattern RL-B1, the second sensing bridge pattern RL-R2, and the gate line GL are spaced apart from each other. The gate pattern may further include the gate electrode (not shown). The gate pattern may be formed by depositing a conductive material and patterning the conductive material.

The gate line GL extends in the first direction DR1. The first scan base pattern TL-B1 surrounds at least one pixel row, but the first scan base pattern TL-B1 has the disconnected shape in an area in which the first scan base pattern TL-B1 overlaps the gate line GL. The first sensing base pattern RL-B1 surrounds at least one pixel column, but the first sensing base pattern RL-B1 has the disconnected shape in an area in which the first sensing base pattern RL-B1 is overlapped with the gate line GL. The second sensing bridge pattern RL-R2 is disposed to cross the data line DL as described later.

The first scan base pattern TL-B1 is connected to the first scan bridge pattern TL-R1 through the first contact hole CH1. The first sensing base pattern RL-R1 is connected to the first sensing bridge pattern RL-R1 through the second contact hole CH2.

The first scan base pattern TL-B1 and the first scan bridge pattern TL-R1 form the current path surrounding at least one pixel row. The first sensing base pattern RL-B1 and the first sensing bridge pattern RL-R1 form the current path surrounding at least one pixel column.

Figure 11D:
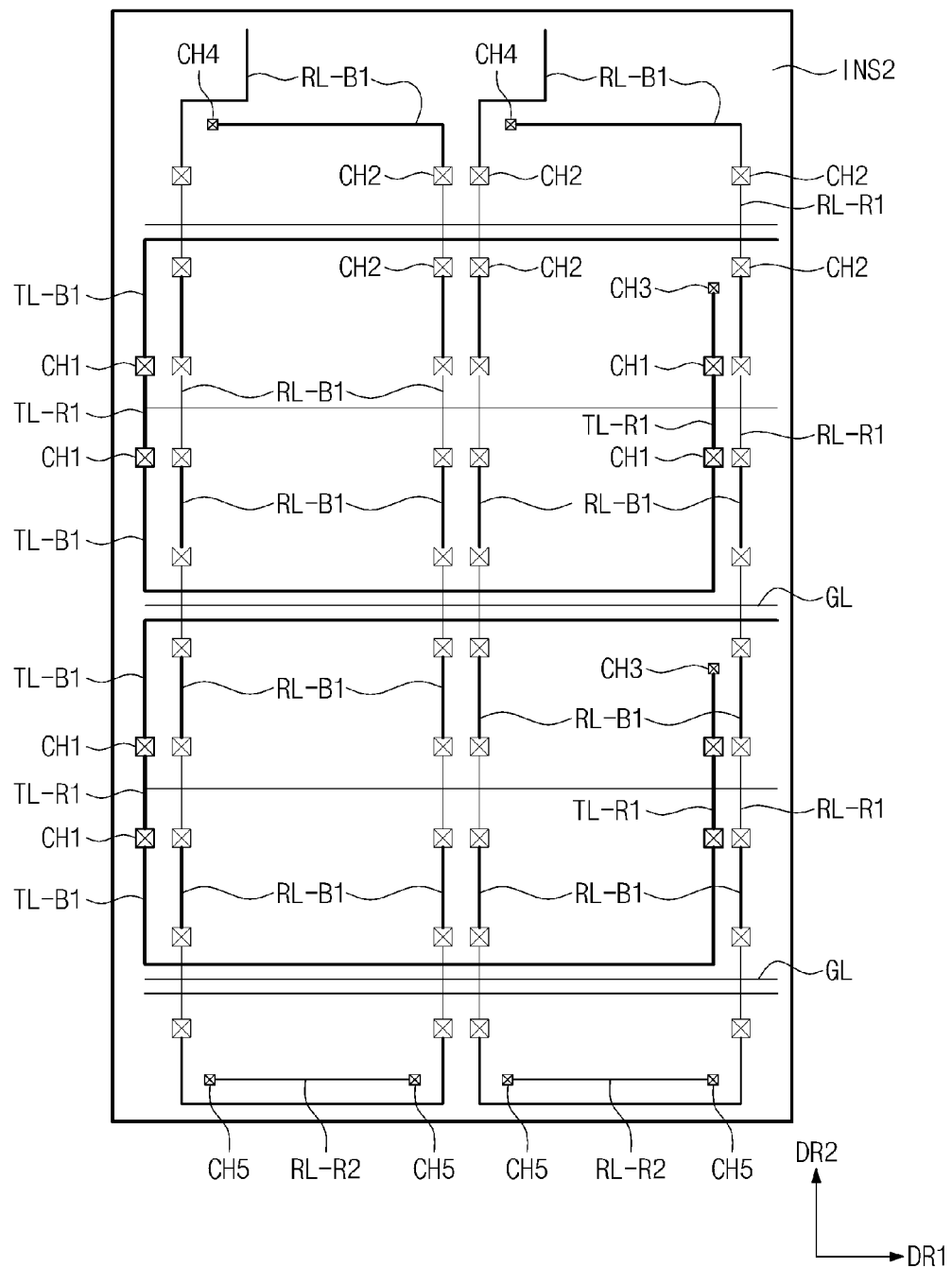

Referring to FIG. 11D, the second insulating layer INS2 is formed on the gate pattern. The second insulating layer INS2 includes the third contact hole CH3 overlapping an end portion of the first scan base pattern TL-B1, the fourth contact holesCH4 overlapping an end portion of the first sensing base pattern RL-B1, and the fifth contact hole CH5 overlapping an end portion of second sensing bridge pattern RL-R2.

The second insulating layer INS2 may be formed by depositing an organic insulating material and/or an inorganic insulating material on the gate pattern and patterning the organic insulating material and/or the inorganic insulating material.

Figure 11E:
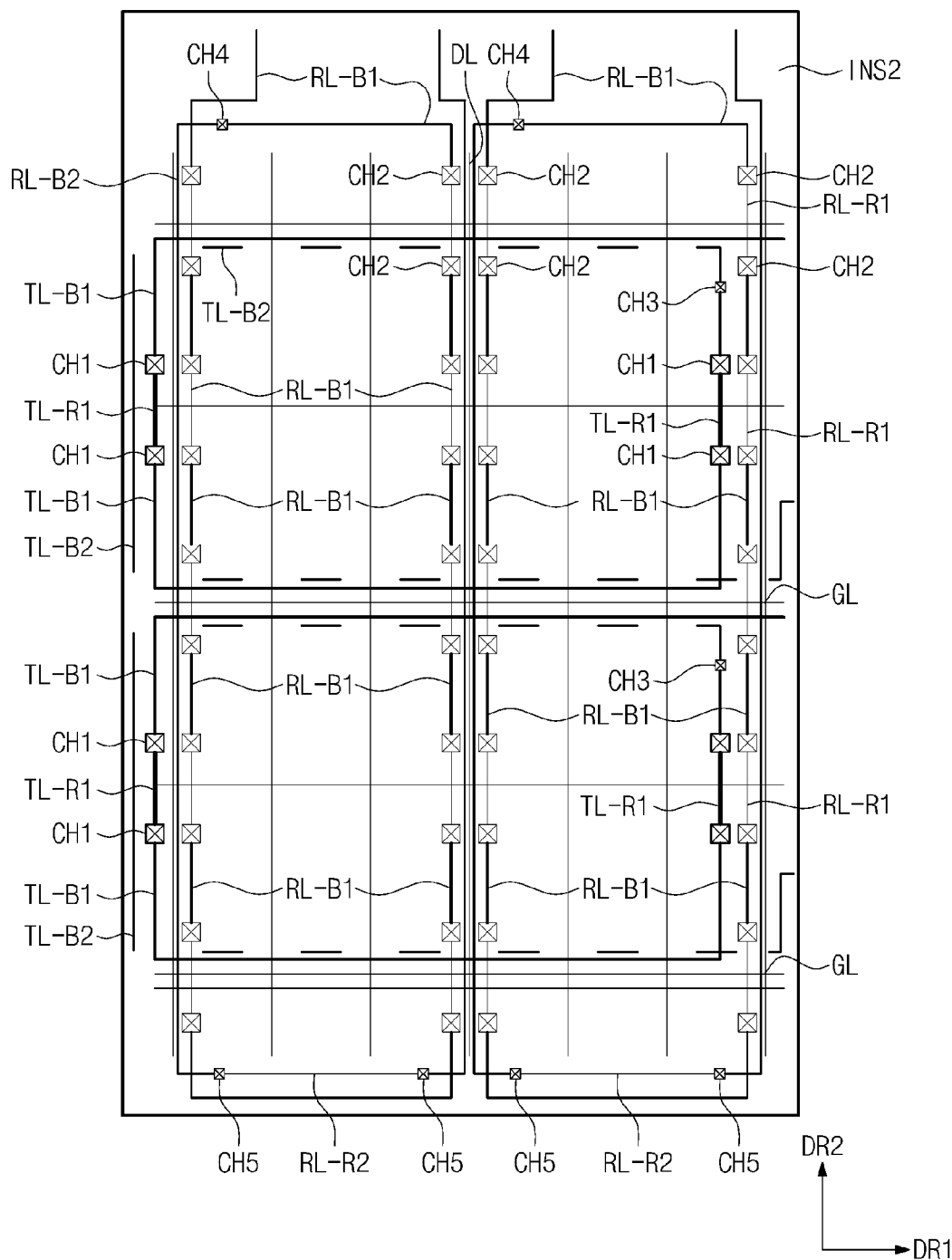

Referring to FIG. 11E, a data pattern is formed on the second insulating layer INS2. The data pattern includes the second scan base pattern TL-B2, the second sensing base pattern RL-B2, and the data line DL. The second scan base pattern TL-B2, the second sensing base pattern RL-B2, and the data line DL are spaced apart from each other. The data pattern may further include the source electrode (not shown) and the drain electrode (not shown).

The data pattern may be formed by depositing a conductive material and patterning the conductive material.

The data line DL extends in the second direction DR2. The second scan base pattern TL-B2 surrounds at least one pixel row, but has the disconnected shape in the area in which the second scan base pattern TL-B2 is overlapped with the data line DL. The second sensing base pattern RL-B2 surrounds at least one pixel column, but has the disconnected shape in the area in which the second sensing base pattern RL-B2 is overlapped with the data line DL.

The first scan base pattern TL-B1 and the second scan base pattern TL-B2 are connected to each other through the third contact hole CH3, and the first sensing base pattern RL-B1 and the second sensing base pattern RL-B2 are connected to each other through the fourth contact hole CH4.

The second sensing base pattern RL-B2 and the second sensing bridge pattern RL-R2 are connected to each other through the fifth contact hole CH5. The second sensing base pattern RL-B2 and the second sensing bridge pattern RL-R2 form the current path surrounding at least one pixel column.

Figure 11F:
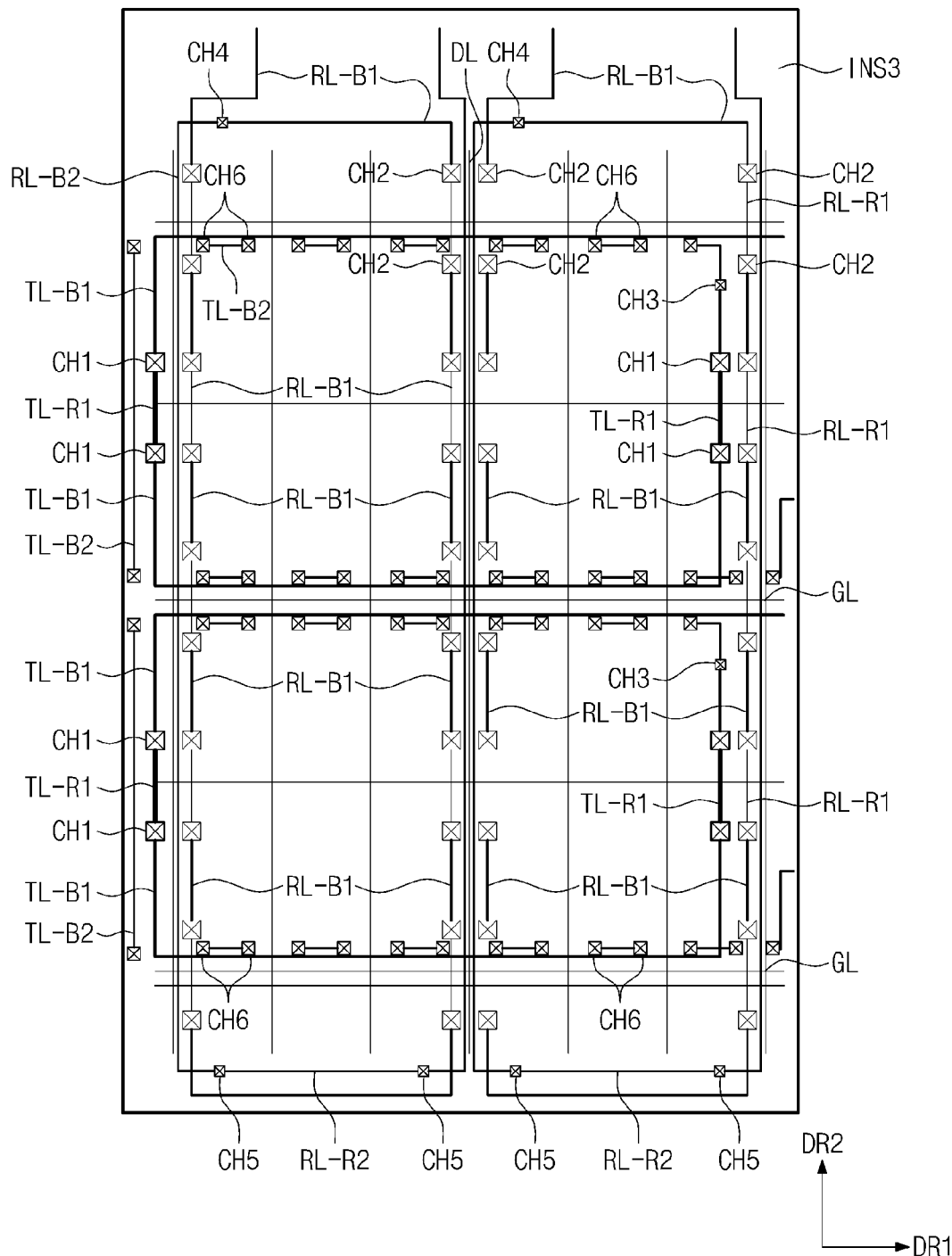

Referring to FIG. 11F, the third insulating layer INS3 is formed on the data pattern. The third insulating layer INS3 includes a sixth contact hole CH6 overlapping the end portion of the second scan base pattern TL-B2.

The third insulating layer INS3 may be formed by depositing an organic insulating material and/or an inorganic insulating material and patterning the organic insulating material and/or the inorganic insulating material.

Figure 11G:
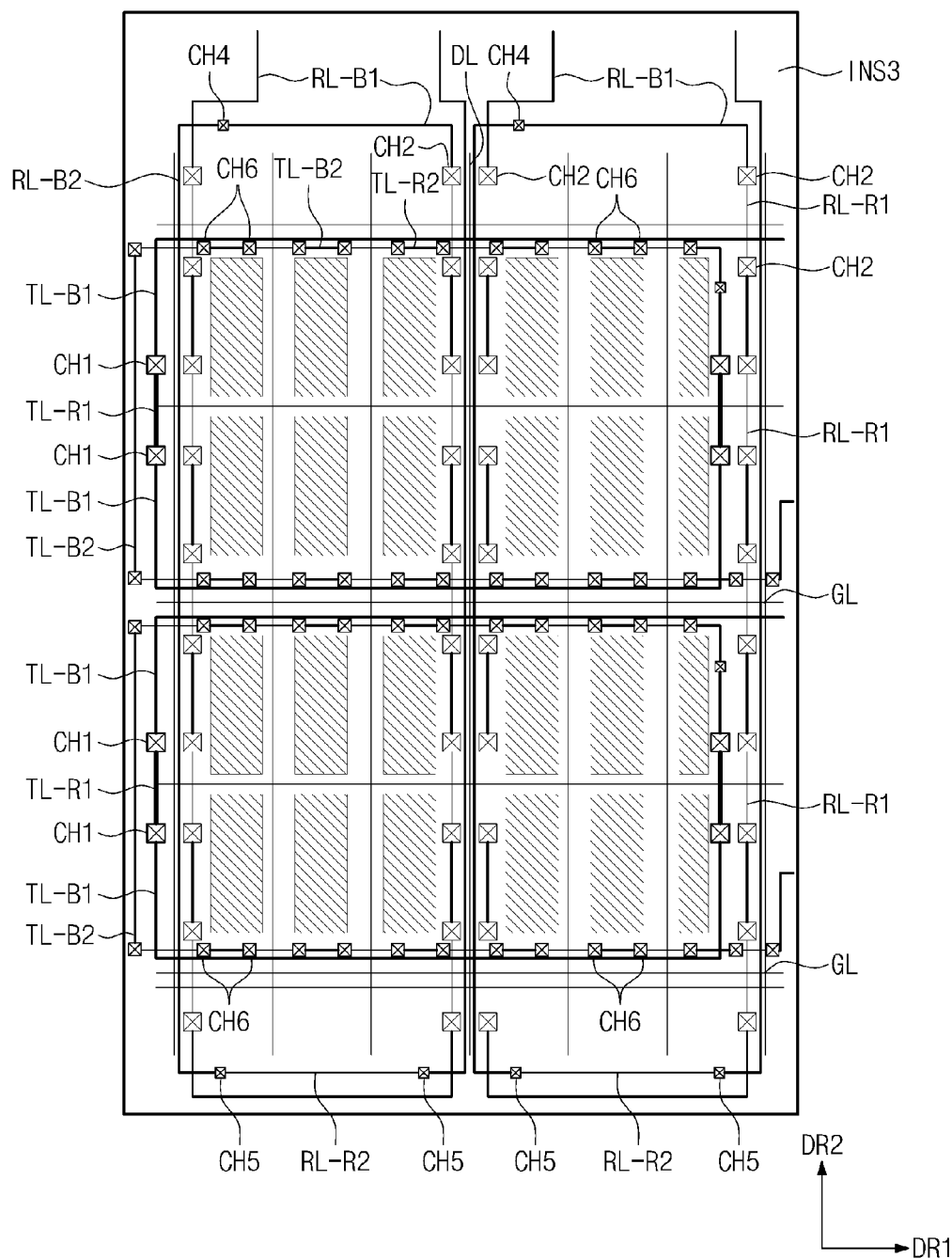

Referring to FIG. 11G, the second scan bridge pattern TL-R2 and the pixel electrode PE are formed on the third insulating layer INS3. The second scan bridge pattern TL-R2 and the pixel electrode PE are spaced apart from each other.

The second scan bridge pattern TL-R2 and the pixel electrode PE may be formed by depositing a transparent conductive material and patterning the transparent conductive material.

The second scan bridge pattern TL-R2 has a shape corresponding to the disconnected area of the second scan base pattern TL-B2. The second scan bridge pattern TL-R2 has the line shape extending in the first direction DR1. The second scan bridge pattern TL-R2 is disposed to cross the data line DL.

The second scan bridge pattern TL-R2 and the second scan base pattern TL-B2 are connected to each other through the sixth contact hole CH6. The second scan base pattern TL-B2 and the second scan bridge pattern TL-R2 form the current path surrounding at least one pixel column.

Figure 11H:
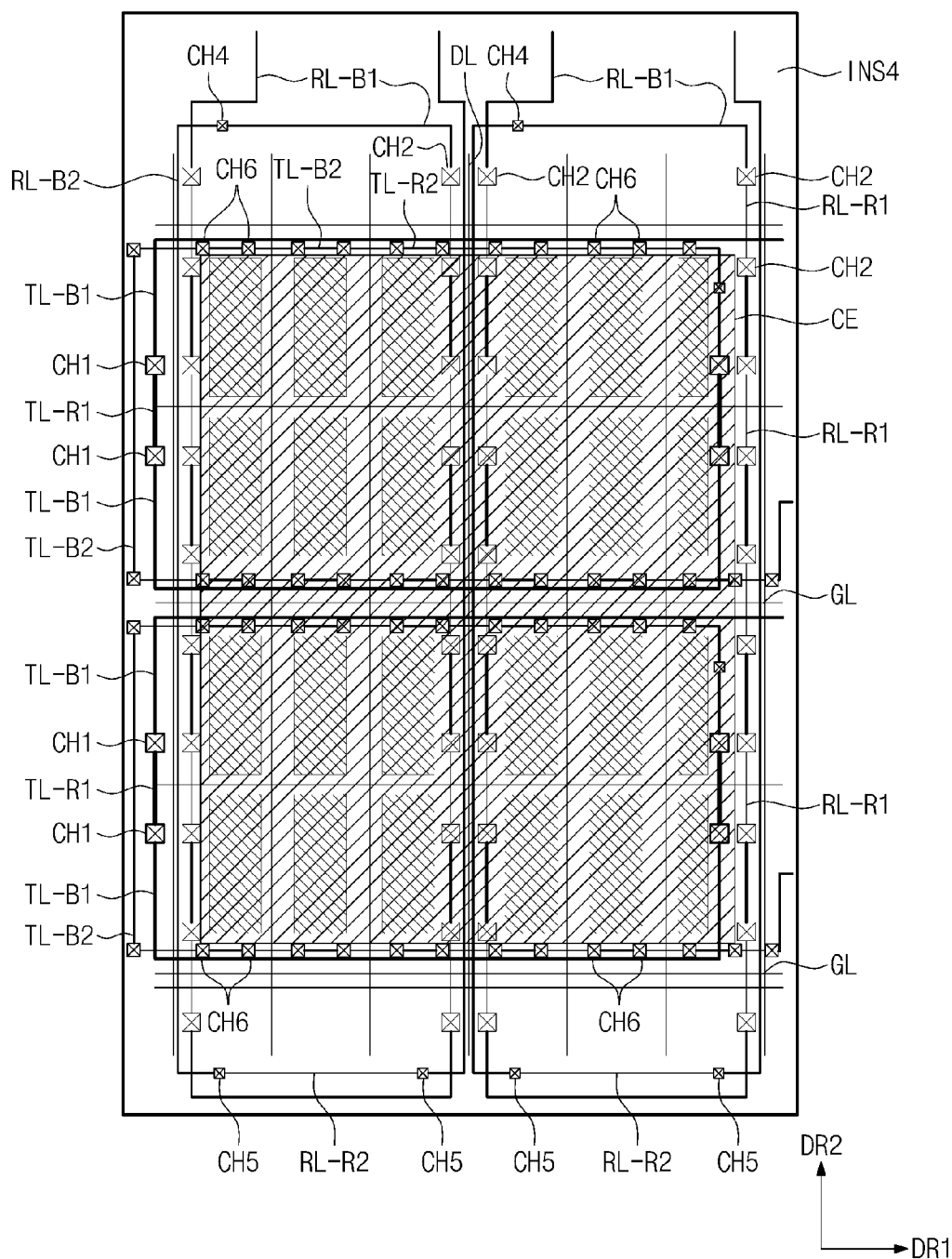

Referring to FIG. 11H, the fourth insulating layer INS4 is formed on the second scan bridge pattern TL-R2 and the pixel electrode PE. The common electrode CE is formed on the fourth insulating layer INS4.

Accordingly, the first display substrate DS1 of the display apparatus is formed. The light blocking layer (not shown) may be formed on the second substrate. The color filters (not shown) may be formed on the light blocking layer (not shown). Therefore, the second display substrate DS2 of the display apparatus is formed.

The liquid crystal layer LCL may be formed between the first and second display substrates DS1 and DS2 and sealed.

According to the above-mentioned manufacturing method of the display apparatus, the scan line that surrounds at least one pixel row two times and the sensing line that surrounds at least one pixel column two times may be formed by the processes applied to form the gate pattern and the data pattern. Thus, no additional process is required to form the scan line and the sensing line, so that a manufacturing cost of the display apparatus is reduced.

Figure 12:
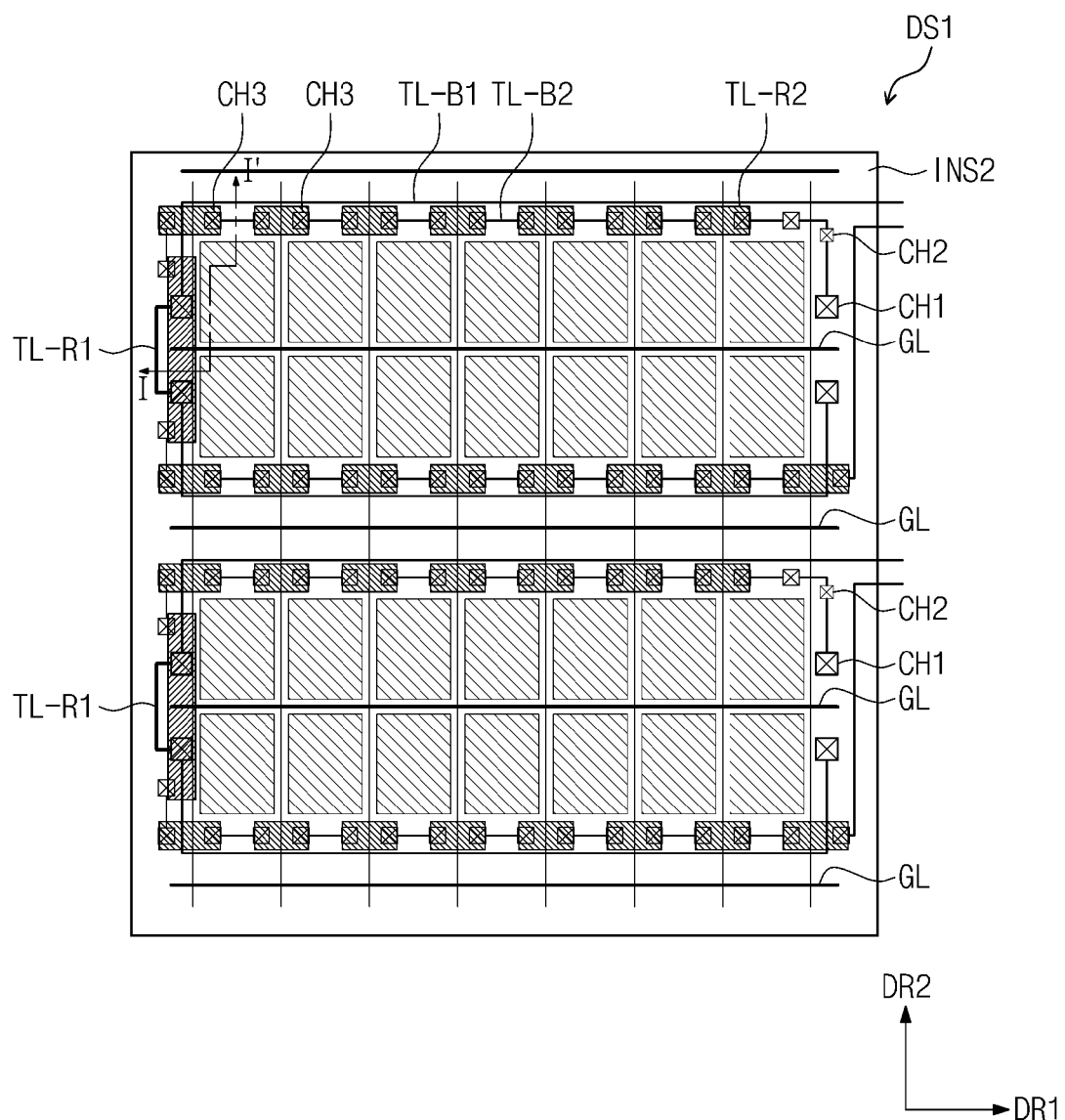
FIG. 12 is a plan view showing a first display substrate of a display panel according to another exemplary embodiment of the present disclosure.
Figure 13:
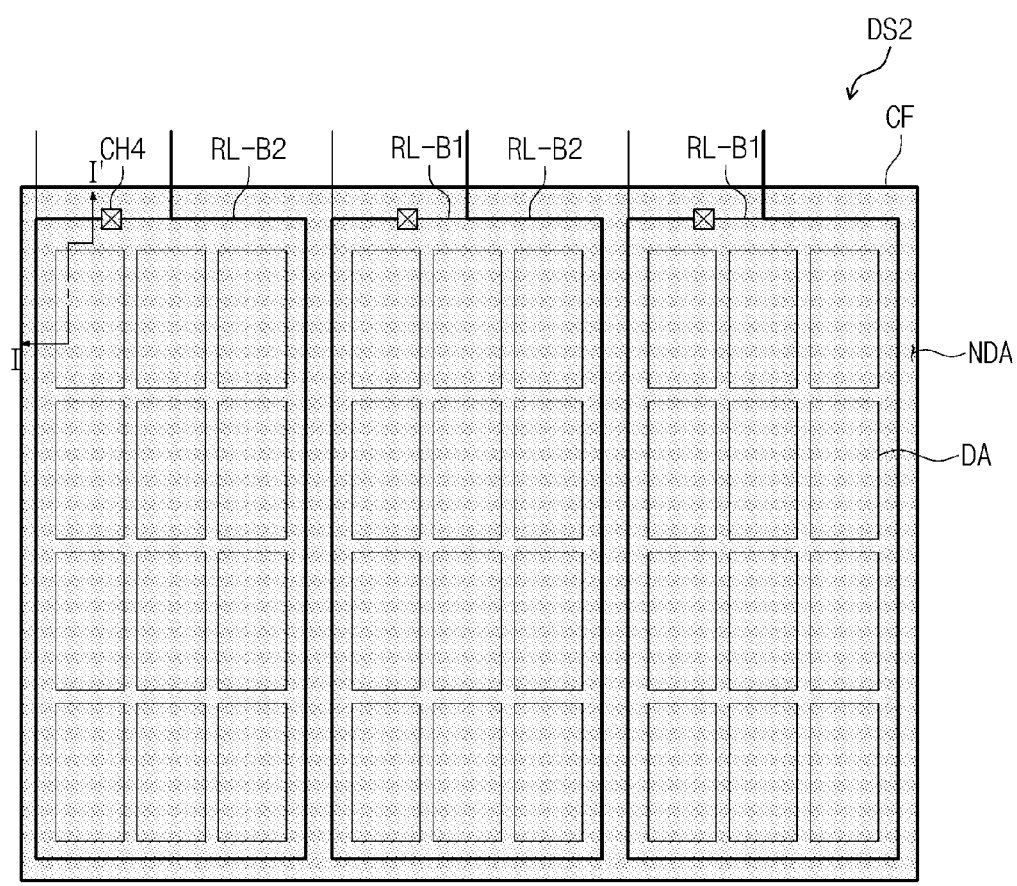
FIG. 13 is a plan view showing a second display substrate of a display panel according to another exemplary embodiment of the present disclosure.
Figure 14:
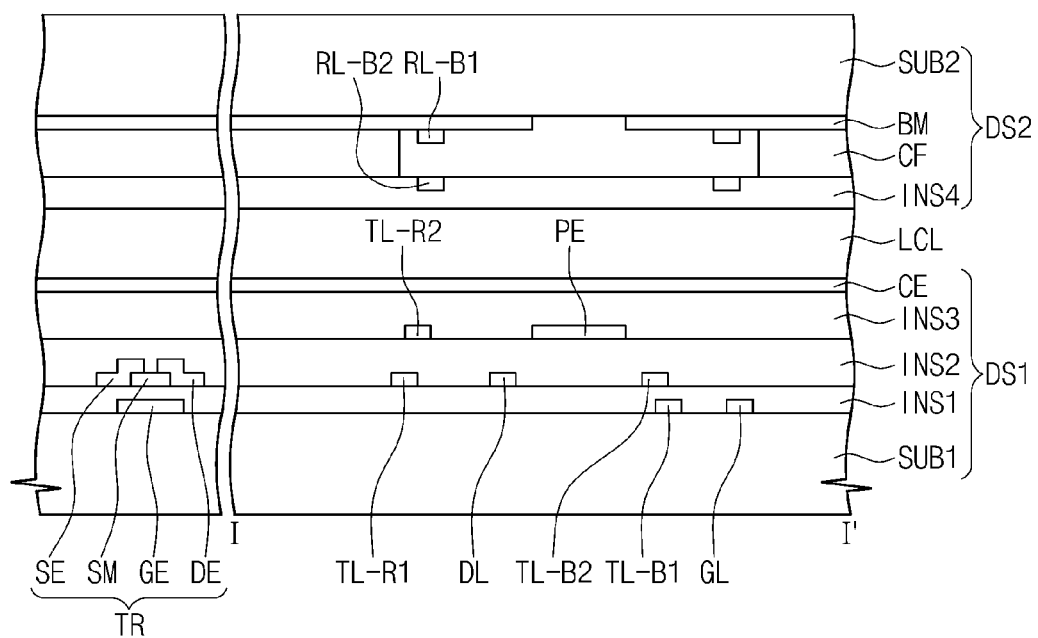
FIG. 14 is a cross-sectional view taken along a line I-I' shown in FIG. 13.
Figure 15:
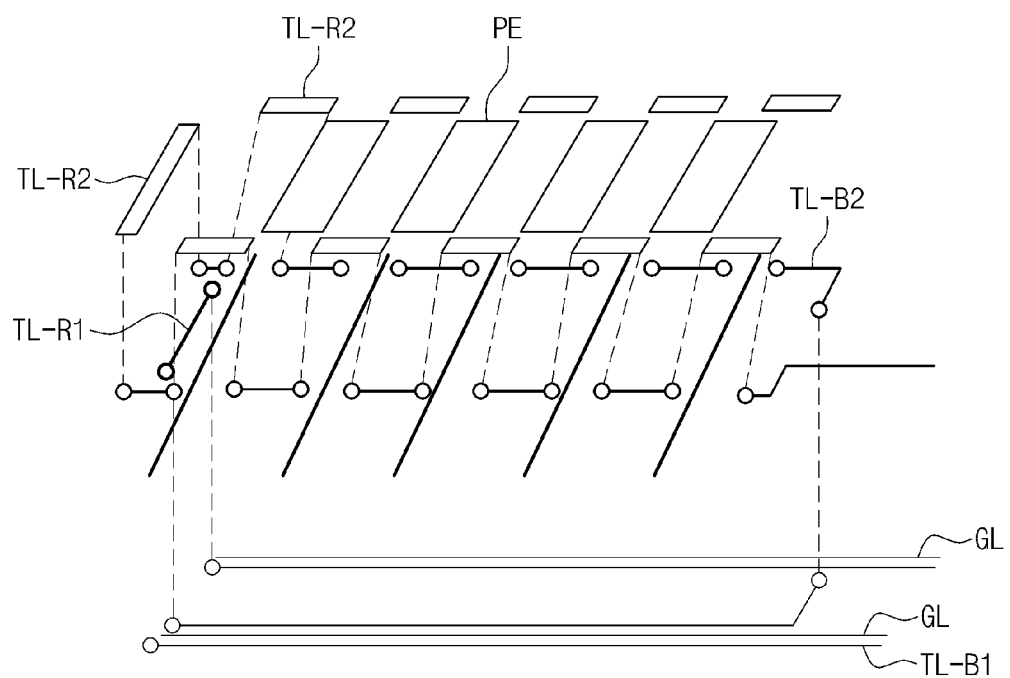
FIG. 15 is a perspective view showing a first display substrate of a display panel according to another exemplary embodiment of the present disclosure.
Figure 16:
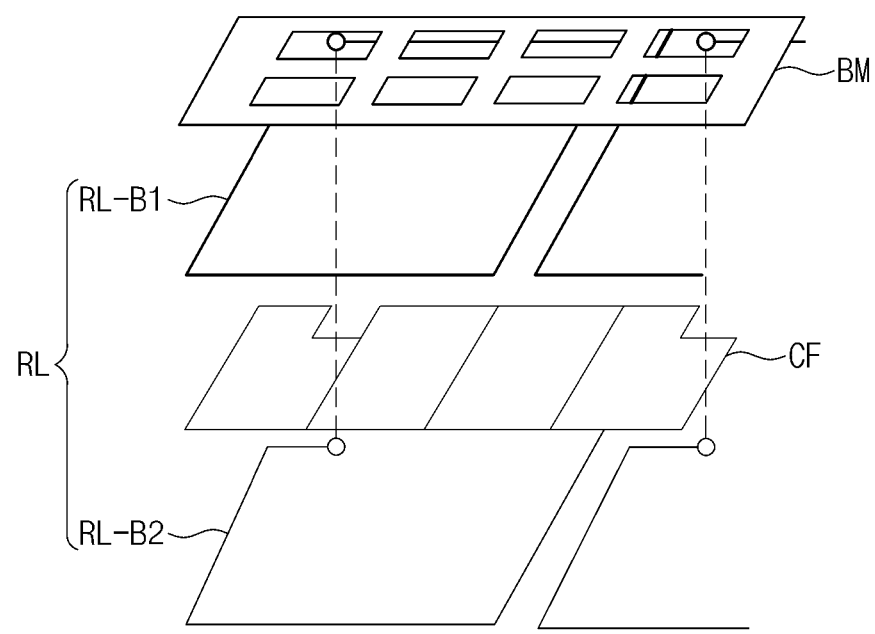
FIG. 16 is a perspective view showing a second display substrate of a display panel according to another exemplary embodiment of the present disclosure.

FIG. 12 is a plan view showing a first display substrate of a display panel according to another exemplary embodiment of the present disclosure. FIG. 13 is a plan view showing a second display substrate of a display panel according to another exemplary embodiment of the present disclosure. FIG. 14 is a cross-sectional view taken along a line I-I' shown in FIG. 13. FIG. 15 is a perspective view showing a first display substrate of a display panel according to another exemplary embodiment of the present disclosure. FIG. 16 is a perspective view showing a second display substrate of a display panel according to another exemplary embodiment of the present disclosure.

In FIGS. 12 to 16, descriptions of the display panel according to another exemplary embodiment will be focused on the differences between this embodiment and the display panel shown in FIGS. 4 to 6.

A gate electrode GE is disposed on a first substrate SUB1. A first insulating layer INS1 is disposed on the gate electrode GE. A semiconductor pattern SM, a source electrode SE, and a drain electrode DE are disposed on the first insulating layer INS1. A second insulating layer INS2 is disposed on the semiconductor pattern SM, the source electrode SE, and the drain electrode DE.

The first display substrate DS1 includes a scan line TL, a pixel electrode PE, and a common electrode CE. The scan line TL includes a first scan base pattern TL-B1, a first scan bridge pattern TL-R1, a second scan base pattern TL-B2, and a second scan bridge pattern TL-R1. The first scan base pattern TL-B1 is disposed on the same layer as the gate line GL. The first scan base pattern TL-B1 is disposed on the first substrate SUB1. The first scan base pattern TL-B1 and the gate line GL are spaced apart from and insulated from each other.

The first scan base pattern TL-B1 surrounds at least one pixel row, but has a disconnected shape in an area in which the first scan base pattern TL-B1 overlaps the gate line GL.

The first scan bridge pattern TL-R1 is disposed on the same layer as the second scan base pattern TL-B2. The first scan bridge pattern TL-R1 and the second scan base pattern TL-B2 are disposed on the same layer as the data line DL.

The first scan bridge pattern TL-R1, the second scan base pattern TL-B2, and the data line DL are spaced apart from and insulated from each other.

The second scan base pattern TL-B2 surrounds at least one pixel row, but has a disconnected shape in an area in which the second scan base pattern TL-B2 overlaps the data line DL. In addition, the first scan bridge pattern TL-R1 has a line shape extending in the second direction DR2 and is disposed to cross the gate line GL.

The first scan bridge pattern TL-R1 and the first scan base pattern TL-B1 are connected to each other. In detail, the first insulating layer INS1 includes a first contact hole CH1 formed therethrough in the area in which the first scan bridge pattern TL-R1 is overlapped with the first scan base pattern TL-B1, and the first scan bridge pattern TL-R1 is connected to the first scan base pattern TL-B1 through the first contact hole CH1.

The first scan bridge pattern TL-R1 and the first scan base pattern TL-B1 form a current path surrounding at least one pixel row.

The first scan base pattern TL-B1 and the second scan base pattern TL-B2 are connected to each other. In detail, the first insulating layer INS1 includes a second contact hole CH2 formed therethrough in an area in which the second scan base pattern TL-B2 is overlapped with a position at which the current path formed by the first scan base pattern TL-B1 and the first scan bridge pattern TL-R1 is ended. The first scan base pattern TL-B1 is connected to the second scan base pattern TL-B2 through the second contact hole CH2.

A second insulating layer INS2 is disposed on the first scan bridge pattern TL-R1, the second scan base pattern TL-B2, and the data line DL. The pixel electrode PE is disposed on the second insulating layer INS2.

The second scan bridge pattern TL-R2 is disposed on the same layer as the pixel electrode PE. The second scan bridge pattern TL-R2 may include the same material as that of the pixel electrode PE, but it should not be limited thereto or thereby. That is, when the positions of the pixel electrode PE and the common electrode CE are changed with respect to each other, the second scan bridge pattern TL-R2 may be disposed on the same layer as the common electrode CE.

The second scan bridge pattern TL-R2 and the pixel electrode PE are spaced apart from and insulated from each other. The second scan bridge pattern TL-R2 has the line shape extending in the first direction DR1. The second scan bridge pattern TL-R2 may cross the data line DL.

The second scan bridge pattern TL-R2 and the second scan base pattern TL-B2 are connected to each other. In detail, the second insulating layer INS2 includes a third contact hole CH3 in the area in which the second scan bridge pattern TL-R2 overlaps the second scan base pattern TL-B2, and the second scan bridge pattern TL-R2 is connected to the second scan base pattern TL-B2 through the third contact hole CH3.

A third insulating layer INS3 is disposed on the pixel electrode PE and the second scan bridge pattern TL-R2. The pixel electrode PE is insulated from the common electrode CE by the third insulating layer INS3. The common electrode CE is disposed on the third insulating layer INS3.

The second scan bridge pattern TL-R2 and the second scan base pattern TL-B2 form a current path surrounding at least one pixel row. Each of the first sensing base pattern RL-B1 and the second sensing base pattern RL-B2 forms a current path surrounding at least one pixel column.

As described above, the scan line TL forms the current path surrounding at least one pixel row two times, and thus a magnetic field having intensity greater than that of the display apparatus shown in FIGS. 4 to 6 may be induced, thereby improving the sensing sensitivity of the input device.

The second display substrate DS2 includes a light blocking layer BM, color filters CF, and a sensing line RL.

The light blocking layer BM is formed on a lower surface of the second substrate SUB2. The light blocking layer BM absorbs the light incident thereto. The light blocking layer BM defines the non-display area NDA shown in FIG. 13. In addition, areas in which the light blocking layer BM is not disposed correspond to the display areas DA shown in FIG. 13 when viewed in a plan view.

The color filters CF are disposed between the light blocking layer BM and the liquid crystal layer LCL. The color filters CF are disposed to respectively correspond to the display areas DA shown in FIG. 13 to assign colors to the light incident thereto. The color filters CF may include red, green, and blue color filters, but are not limited thereto. In addition, the color filters CF may include an insulating material.

The sensing line RL includes a first sensing base pattern RL-B1 and a second sensing base pattern RL-B2. The first sensing base pattern RL-B1 and the second sensing base pattern RL-B2 overlap the light blocking layer BM.

The first sensing base pattern RL-B1 is disposed between the light blocking layer BM and the color filters CF. The first sensing base pattern RL-B1 is disposed to surround at least one pixel column. The first sensing base pattern RL-B1 forms a current path to surround at least one pixel column.

The second sensing base pattern RL-B2 are disposed on the lower surface of the color filters CF. The second sensing base pattern RL-B2 is disposed to surround at least pixel column. The second sensing base pattern RL-B2 forms a current path surrounding at least one pixel column.

The first sensing base pattern RL-B1 and the second sensing base pattern RL-B2 are connected to each other. In detail, the color filters CF may include a fourth contact hole CH4 formed therethrough in the area in which the second sensing base pattern is overlapped with a position at which the current path formed by the first sensing base pattern RL-B1 is ended. The first sensing base pattern RL-B1 is connected to the second sensing base pattern RL-B2 through the fourth contact hole CH4.

The second display substrate DS2 may further include a fourth insulating layer INS4 disposed on the second sensing base pattern RL-B2. The fourth insulating layer INS4 planarizes the lower surface of the second display substrate DS2 adjacent to the liquid crystal layer LCL and insulates the second sensing base pattern RL-B2 from other components.

As described above, since the sensing line RL forms the current path surrounding at least one pixel column two times, it is advantageous to sense the sensing signal induced from the resonance of the input device when compared to that of the display apparatus shown in FIGS. 4 to 6. As a result, the sensing sensitivity with respect to the input device may be improved.

FIGS. 17A to 17E are plan views showing a manufacturing method of the first display substrate of a display apparatus shown in FIGS. 12 to 16.

Figure 17A:
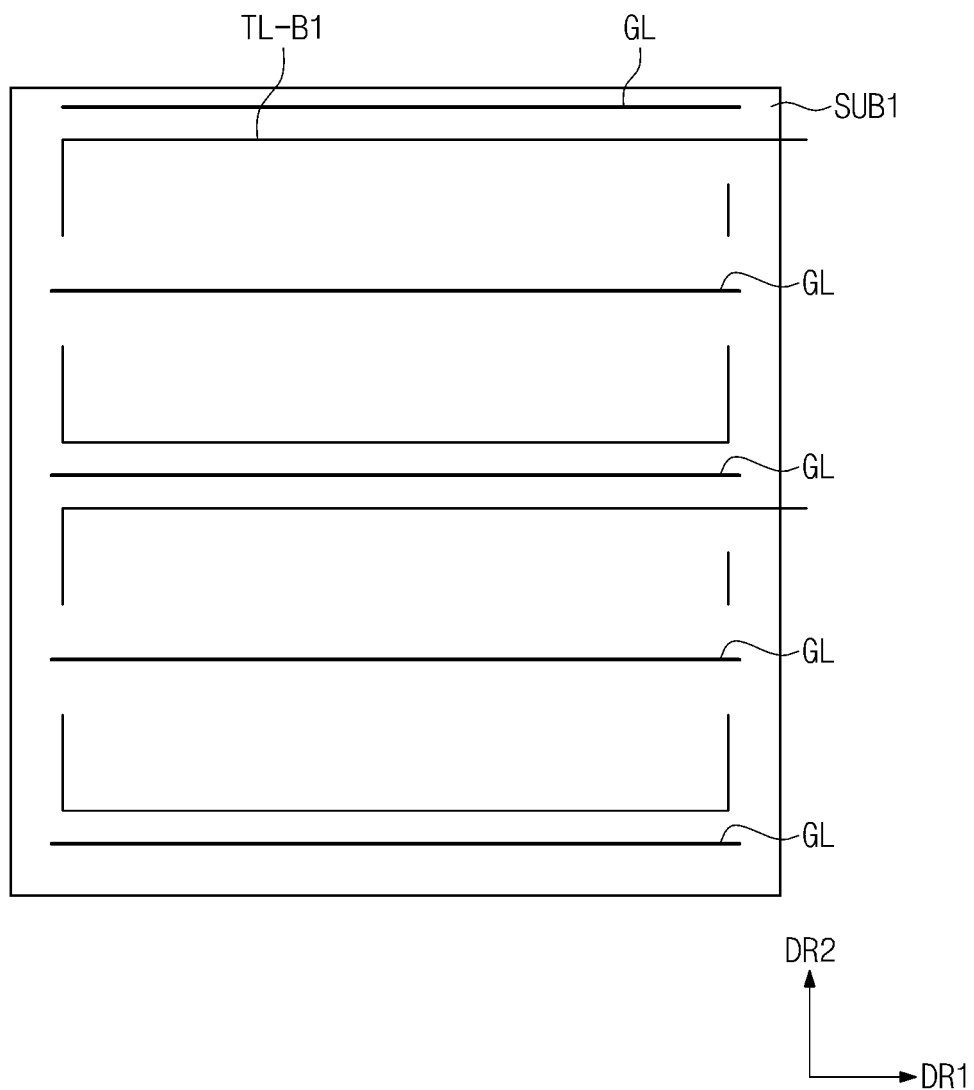
FIGS. 17A, 17B, 17C, 17D, and 17E are plan views showing a manufacturing method of the first display substrate of a display apparatus shown in FIGS. 12 to 16.

Referring to FIG. 17A, a gate pattern is formed on the first substrate SUB1. The gate pattern includes the first scan base pattern TL-B1 and the gate line GL. The first scan base pattern TL-B1 and the gate line GL are spaced apart from each other. The gate pattern may further include the gate electrode (not shown). The gate pattern may be formed by depositing a conductive material and patterning the conductive material.

The gate line GL extends in the first direction DR1. The first scan base pattern TL-B1 surrounds at least one pixel row, but has the disconnected shape in the area in which the first scan base pattern TL-B1 is overlapped with the gate line GL.

Figure 17B:
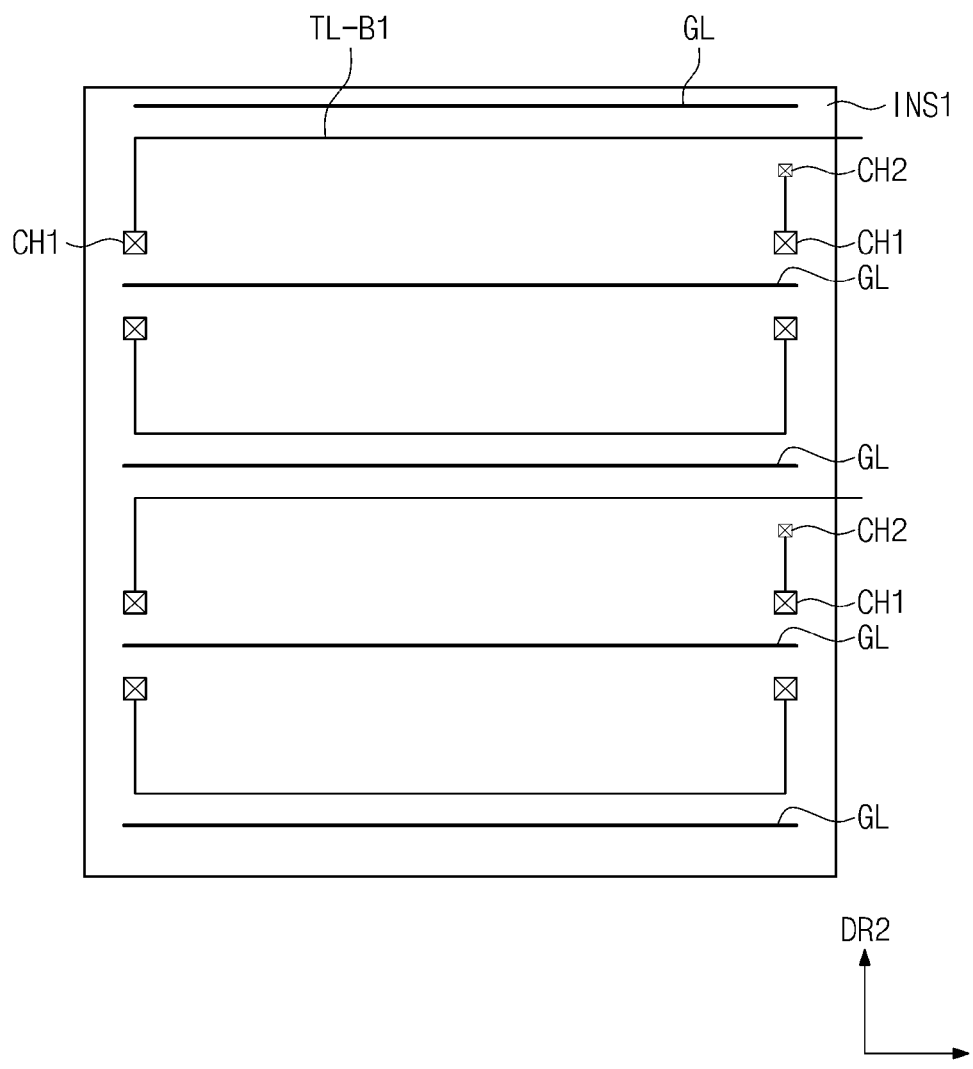

Referring to FIG. 17B, the first insulating layer INS1 is formed on the gate pattern. The first insulating layer INS1 includes the first and second contact holes CH1 and CH2 overlapped with the first scan base pattern TL-B1.

The first insulating layer INS1 may be formed by depositing the organic insulating material and/or the inorganic insulating material on the gate pattern and patterning the organic insulating material and/or the inorganic insulating material.

Figure 17C:
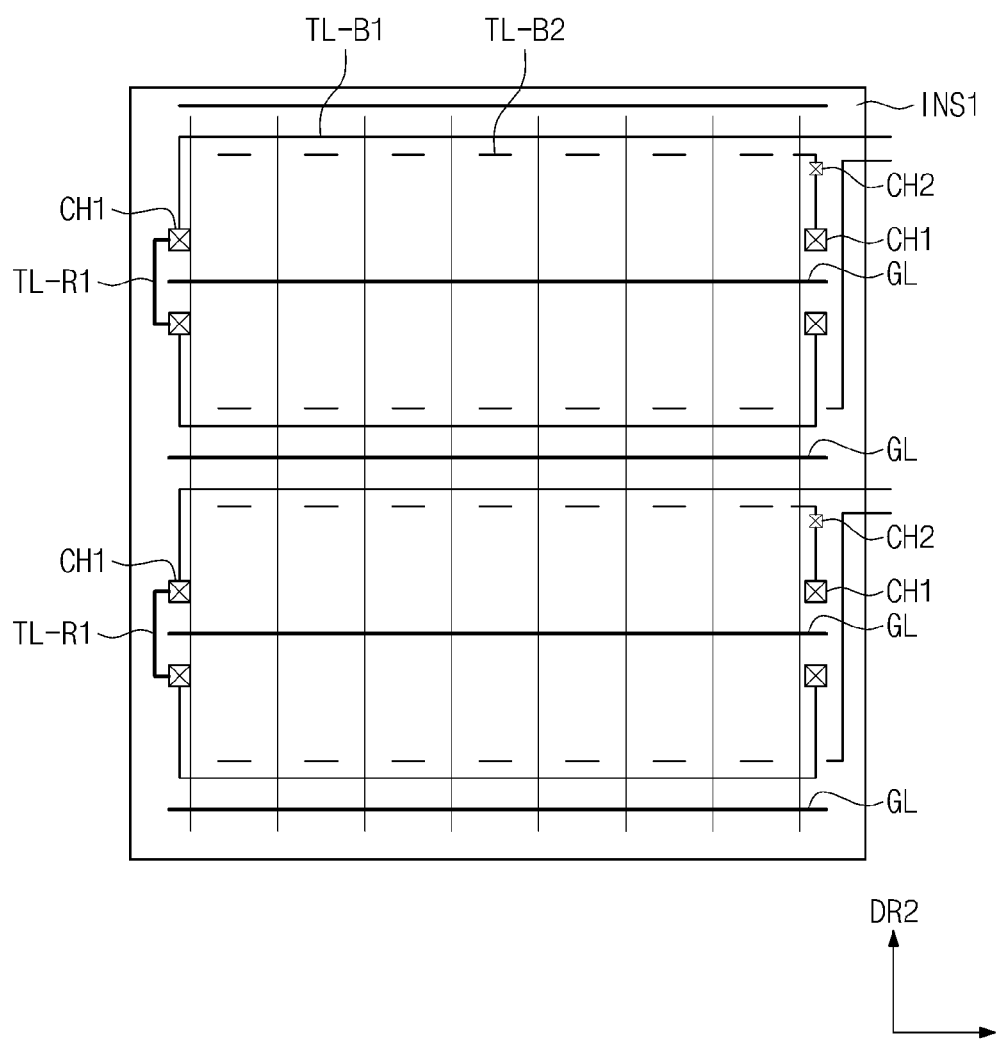

Referring to FIG. 17C, the data pattern is formed on the first insulating layer INS1. The data pattern includes the second scan base pattern TL-B2, the first scan bridge pattern TL-R1, and the data line DL. The second scan base pattern TL-B2, the first scan bridge pattern TL-R1, and the data line DL are spaced apart from each other, The data pattern may further include the source electrode (not shown) and the drain electrode (not shown). The data pattern may be formed by depositing a conductive material and patterning the conductive material.

The data line DL extends in the second direction DR2. The second scan base pattern TL-B2 surrounds at least one pixel, but has the disconnected shape in the area in which the second scan base pattern TL-B2 is overlapped with the data line DL. The first scan bridge pattern TL-R1 has a line shape extending in the second direction DR2.

The first scan base pattern TL-B1 and the first scan bridge pattern TL-R1 are connected to each other through the first contact hole CH1. The first scan base pattern TL-B1 and the first scan bridge pattern TL-R1 form the current path surrounding at least one pixel row.

The first scan base pattern TL-B1 and the second scan base pattern TL-B2 are connected to each other through the second contact hole CH2. The second contact hole CH2 is formed at the position at which the current path formed by the first scan base pattern TL-B1 and the first scan bridge pattern TL-R1 is ended.

Figure 17D:
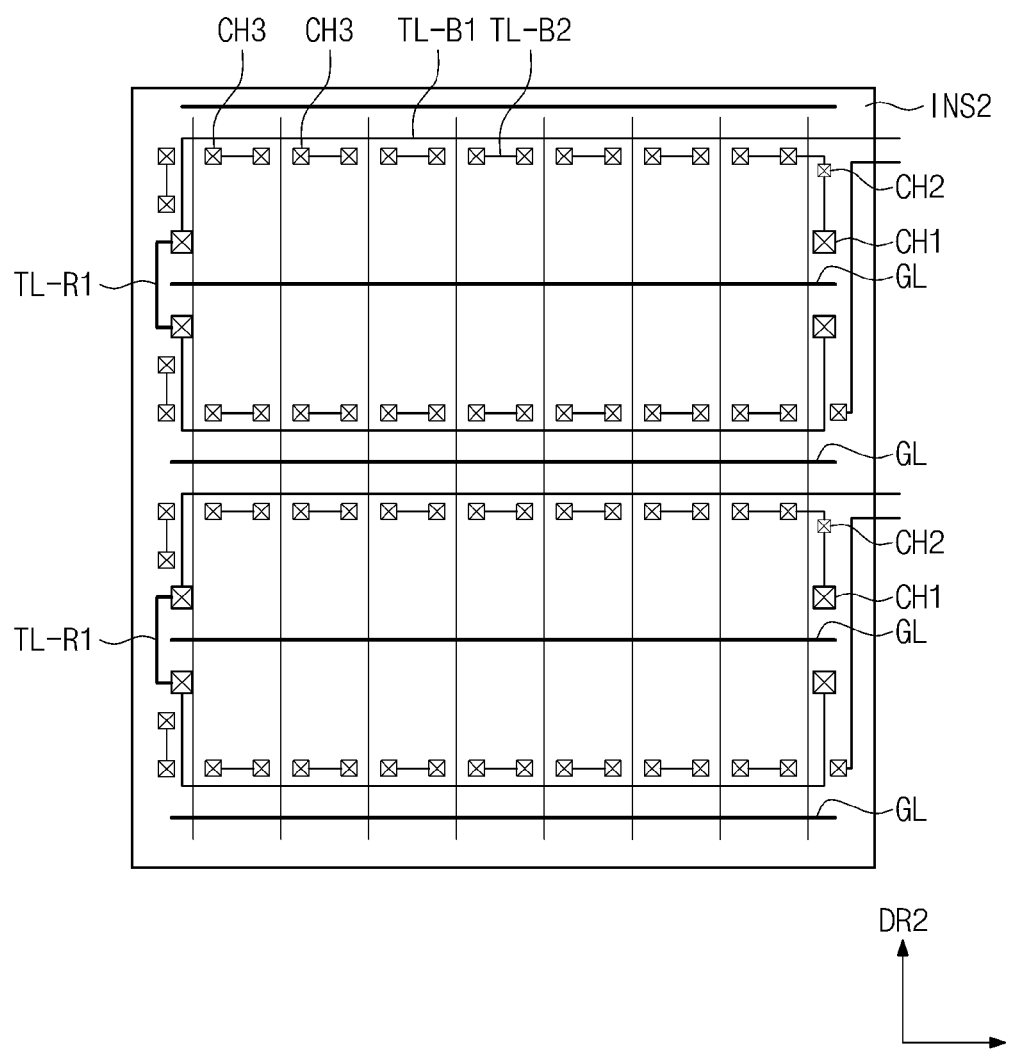

Referring to FIG. 17D, the second insulating layer INS2 is formed on the data pattern. The second insulating layer INS2 includes the third contact hole CH3 overlapping the second scan base pattern TL-B2.

The second insulating layer INS2 may be formed by depositing the organic insulating material and/or the inorganic insulating material on the gate pattern and patterning the organic insulating material and/or the inorganic insulating material.

Figure 17E:
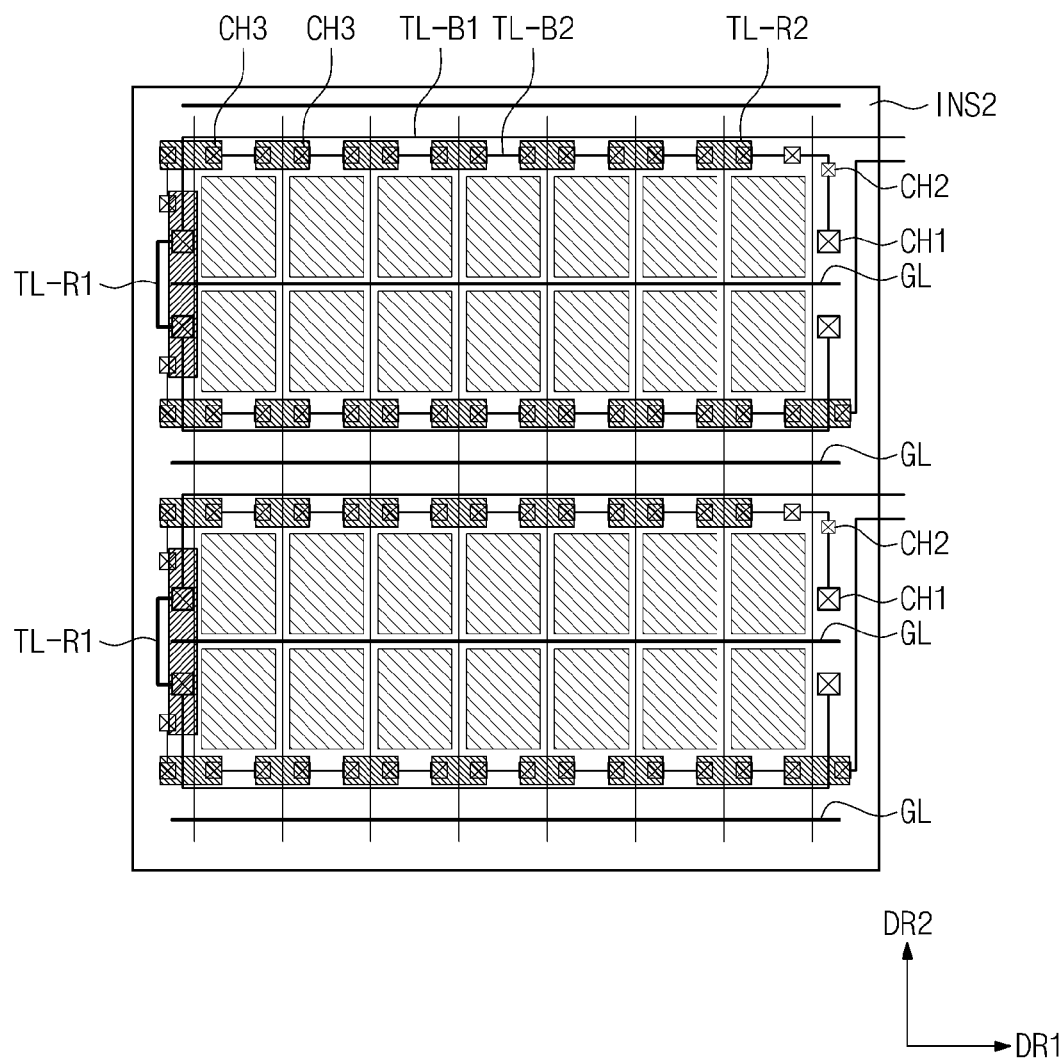

Referring to FIG. 17E, the second scan bridge pattern TL-R2 and the pixel electrode PE are formed on the second insulating layer INS2. The second scan bridge pattern TL-R2 and the pixel electrode PE are spaced apart from each other. The second scan bridge pattern TL-R2 and the pixel electrode PE may be formed by depositing a transparent conductive material and patterning the transparent conductive material.

The second scan bridge pattern TL-R2 has a shape corresponding to the disconnected area of the second scan base pattern TL-B2. The second scan bridge pattern TL-R2 crosses the data line DL.

The second scan bridge pattern TL-R2 and the second scan base pattern TL-B2 are connected to each other through the third contact hole CH3. The second scan base pattern TL-B2 and the second scan bridge pattern TL-R2 form the current path surrounding at least one pixel row. The third insulating layer is formed on the second scan bridge pattern TL-R2 and the pixel electrode PE. The common electrode CE is formed on the third insulating layer. Accordingly, the first display substrate DS1 of the display apparatus is formed.

Figure 18A:
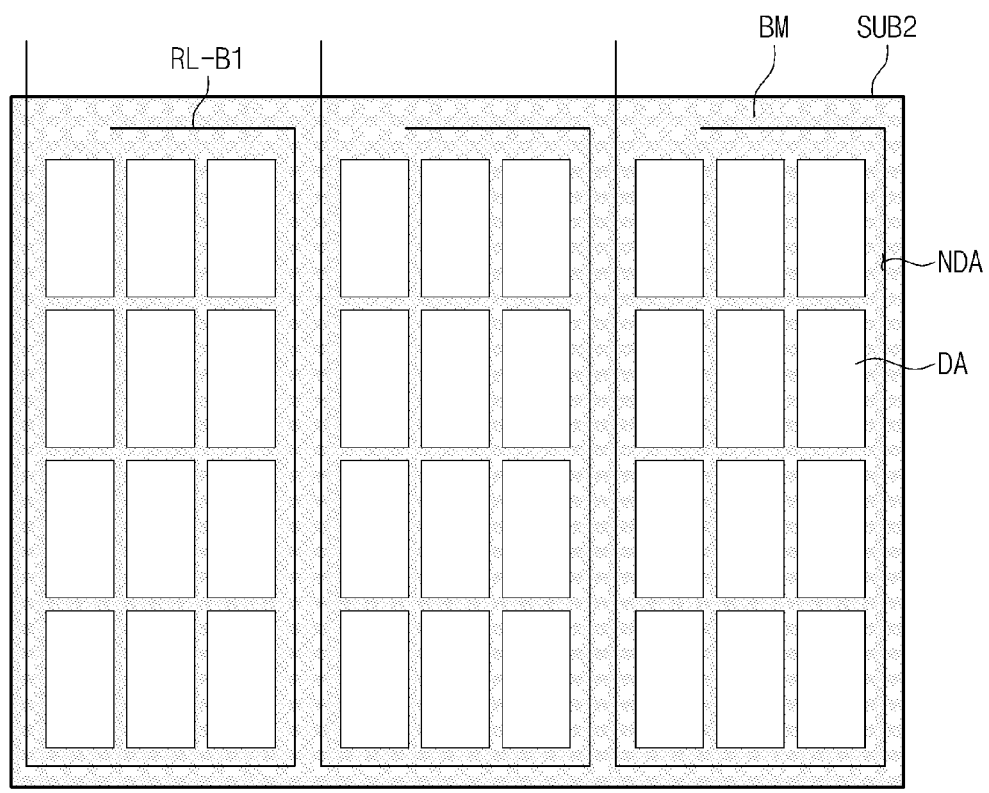
FIGS. 18A, 18B, and 18C are plan views showing a manufacturing method of the second display substrate of the display apparatus shown in FIGS. 12 to 16.
Figure 18B:
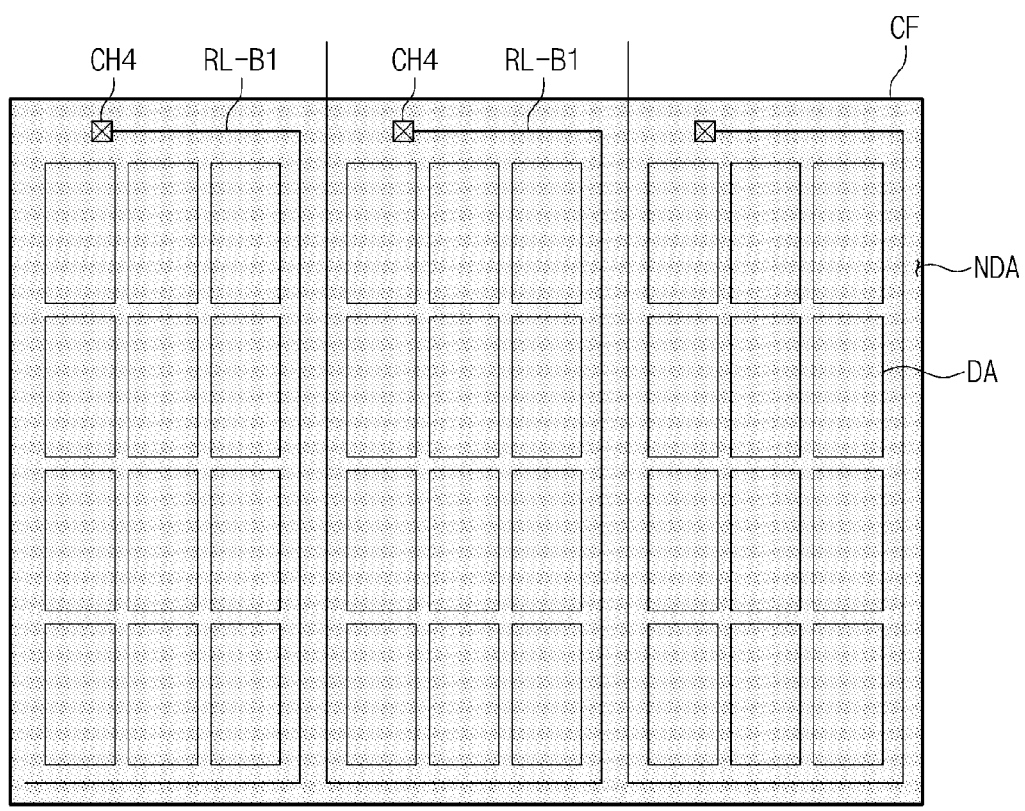
Figure 18C:
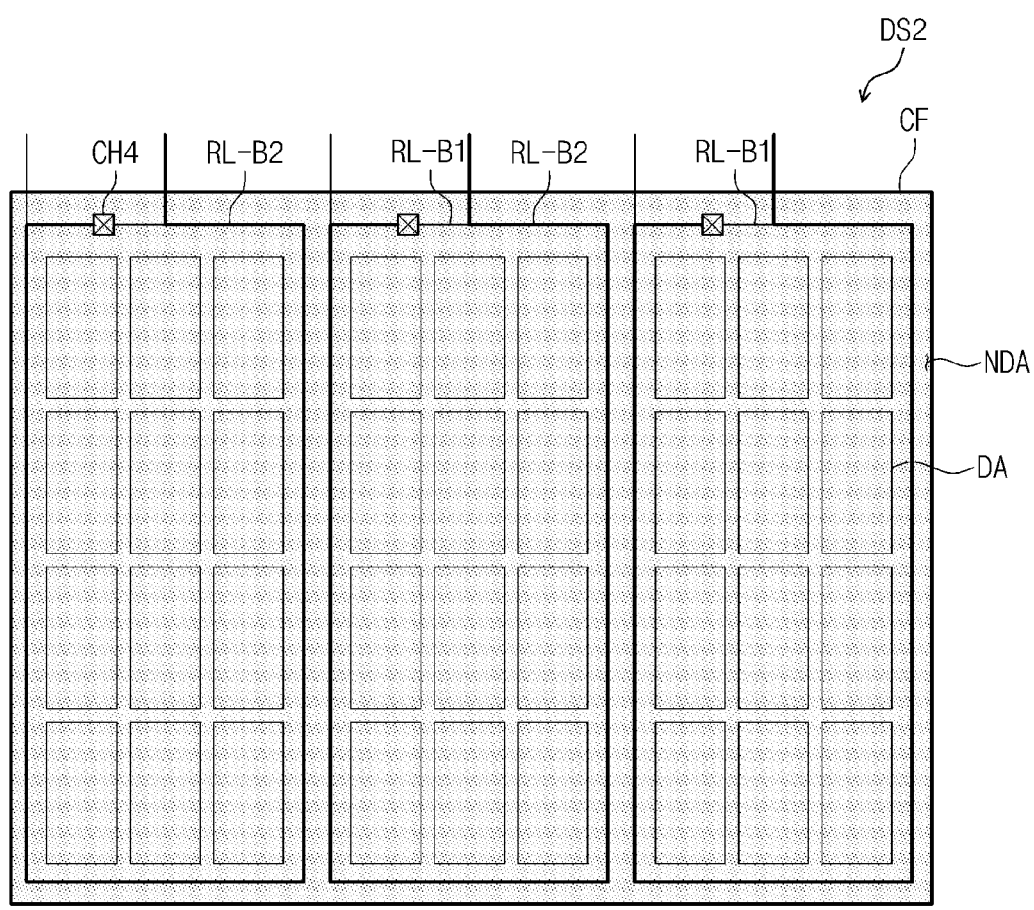

FIGS. 18A to 18C are plan views showing a manufacturing method of the second display substrate of the display apparatus shown in FIGS. 12 to 16.

Referring to FIG. 18A, the light blocking layer BM is formed on the second substrate SUB2. The light blocking layer BM may be formed by deposition an organic or inorganic material containing black dyes and patterning the organic or inorganic material, but it should not be limited thereto or thereby. For instance, the light blocking layer BM may be formed by attaching a film including a black pattern thereon to the second substrate SUB2.

The light blocking layer BM is formed to correspond to the non-display area NDA, and is arranged in the matrix form.

The first sensing base pattern RL-B1 is formed on the light blocking layer BM. The first sensing base pattern RL-B1 overlaps the light blocking layer BM. The first sensing base pattern RL-B1 may be formed by depositing the conductive material and patterning the conductive material.

The first sensing base pattern RL-B1 surrounds at least one pixel column. The first sensing base pattern RL-B1 forms the current path surrounding at least one pixel column.

Referring to FIG. 18B, the color filters CF are formed on the first sensing base pattern RL-B1. The color filters CF may include the red, green, and blue color filters, but are not limited thereto. Each of the red color filters, the green color filters, and the blue color filters may be formed through a separate photolithography process.

The color filters CF include the fourth contact hole CH4 formed at the position at which the current path formed by the first sensing base pattern RL-B1 is ended. The color filters CF may be formed by depositing an organic insulating material or an inorganic insulating material and patterning the organic insulating material or the inorganic insulating material.

Referring to FIG. 18C, the sensing base pattern RL-B2 is formed on the color filters CF. The second sensing base pattern RL-B2 is formed to overlap with the light blocking layer BM.

The second sensing base pattern RL-B2 may be formed by depositing the conductive material and patterning the conductive material. The second sensing base pattern RL-B2 is disposed to surround at least one pixel column. The second sensing base pattern RL-B2 forms a current path surrounding at least one pixel column.

The first sensing base pattern RL-B1 and the second sensing base pattern RL-B2 are connected to each other through the fourth contact hole CH4. The fourth insulating layer INS4 is formed on the second sensing base pattern RL-B2. In this manner, the second display substrate DS2 of the display apparatus is formed.

The liquid crystal layer LCL may be formed between the first and second display substrates DS1 and DS2 and sealed.

According to the above-mentioned manufacturing method of the display apparatus, the scan line that surrounds at least one pixel row two times and the sensing line that surrounds at least one pixel column two times may be formed by the processes applied to form the gate pattern and the data pattern. Thus, no additional process is required to form the scan line and the sensing line, so that a manufacturing cost of the display apparatus is reduced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus, comprising:
    a first display substrate comprising gate lines extending in a first direction, data lines disposed on a different layer from the gate lines and extending in a second direction crossing the first direction, and a first electrode disposed on a different layer from the gate lines and the data lines;
    a second display substrate facing the first display substrate;
    pixels comprising pixel rows and pixel columns and disposed on the first display substrate;
    a scan line disposed on the first display substrate or the second display substrate and surrounding at least one pixel row of the pixel rows, the scan line comprising:
        a first scan base pattern disposed on a same layer as a gate line of the gate lines; and
        a first scan bridge pattern;
    a sensing line disposed on the first display substrate or the second display substrate, insulated from the scan line, and surrounding at least one pixel column of the pixel columns;
    a first driver configured to apply a scan signal to the scan line to induce a magnetic field by a current path of the scan line;
    a second driver configured to receive a sensing signal from the sensing line, the signal generated by a resonant frequency of an input device, and further configured to output the sensing signal; and
    a coordinate calculator configured to receive the sensing signal and calculate coordinate information of an input position, wherein each of the scan line and the sensing line is disposed on different layers from each other.

2. The display apparatus of claim 1, wherein the scan line and the sensing line are disposed on the first display substrate.

3. The display apparatus of claim 2, wherein the first scan bridge pattern is disposed on a same layer as the data line.

4. The display apparatus of claim 3, wherein the first scan base pattern surrounds the at least one pixel row and has a disconnected shape in an area where the first scan base pattern overlaps the gate line, the first scan bridge pattern overlaps the gate line, and the first scan base pattern and the first scan bridge pattern are electrically connected to each other.

5. The display apparatus of claim 3, wherein the sensing line comprises:
    a first sensing base pattern disposed on a same layer as the gate line; and
    a first sensing bridge pattern disposed on a same layer as the data line.

6. The display apparatus of claim 5, wherein the first sensing base pattern surrounds the at least one pixel column and has a disconnected shape in an area where the first sensing base pattern overlaps with the gate line, the first sensing bridge pattern overlaps the gate line, and the first sensing base pattern and the first sensing bridge pattern are electrically connected to each other.

7. The display apparatus of claim 2, wherein:
    the scan line further comprises:
        a second scan base pattern disposed on a same layer as the data line; and
        a second scan bridge pattern disposed on a same layer as the first electrode; and
    the first scan bridge pattern is insulated from the gate line and the data line and disposed under the gate line and the data line.

8. The display apparatus of claim 7, wherein the first scan base pattern surrounds the at least one pixel row and has a disconnected shape in an area where the first scan base pattern overlaps the gate line, the second scan base pattern surrounds the at least one pixel row and has a disconnected shape in an area where the second scan base pattern overlaps the data line, the first scan bridge pattern overlaps the gate line, the second scan bridge pattern overlaps the data line, the first scan base pattern and the first scan bridge pattern are electrically connected to each other, the second scan base pattern and the second scan bridge pattern are electrically connected to each other, and the first scan base pattern and the second scan base pattern are electrically connected to each other.

9. The display apparatus of claim 7, wherein the sensing line comprises:
    a first sensing bridge pattern disposed on a same layer as the first scan bridge pattern;
    a first sensing base pattern disposed on a same layer as the first scan base pattern;
    a second sensing base pattern disposed on a same layer as the second scan base pattern; and
    a second sensing bridge pattern disposed on a same layer as the first sensing base pattern and spaced apart from the first sensing base pattern.

10. The display apparatus of claim 9, wherein the first sensing base pattern surrounds the at least one pixel column and has a disconnected shape in an area where the first sensing base pattern overlaps the gate line, the second sensing base pattern surrounds the at least one pixel column and has a disconnected shape in an area where the second sensing base pattern overlaps the data line, the first sensing bridge pattern overlaps the gate line, the second sensing bridge pattern overlaps the data line, the first sensing base pattern and the first sensing bridge pattern are electrically connected to each other, the second sensing base pattern and the second sensing bridge pattern are electrically connected to each other, and the first sensing base pattern and the second sensing base pattern are electrically connected to each other.

11. The display apparatus of claim 1, wherein the scan line is disposed on the first display substrate and the sensing line is disposed on the second display substrate.

12. The display apparatus of claim 11, wherein:
    the scan line further comprises:
        a second scan base pattern disposed on a same layer as the data line; and
        a second scan bridge pattern disposed on a same layer as the first electrode; and the first scan bridge pattern disposed on a same layer as the second scan base pattern and spaced apart from the second scan base pattern.

13. The display apparatus of claim 12, wherein the first scan base pattern surrounds the at least one pixel row and has a disconnected shape in an area where the first scan base pattern overlaps the gate line, the second scan base pattern surrounds the at least one pixel column and has a disconnected shape in an area where the second scan base pattern overlaps the data line, the first scan bridge pattern overlaps the gate line, the second scan bridge pattern overlaps the data line, the first scan base pattern and the first scan bridge pattern are electrically connected to each other, the second scan base pattern and the second scan bridge pattern are electrically connected to each other, and the first scan base pattern and the second scan base pattern are electrically connected to each other.

14. The display apparatus of claim 11, wherein the second display substrate comprises:
- a substrate;
- a light blocking layer disposed on the substrate; and
- color filters disposed on the light blocking layer, and the sensing line comprises:
- a first sensing base pattern disposed between the light blocking layer and the color filters; and
- a second sensing base pattern facing the first sensing base pattern such that the color filters are disposed between the first and second sensing base patterns.

15. The display apparatus of claim 14, wherein each of the first sensing base pattern and the second sensing base pattern overlaps the light blocking layer and surrounds the at least one pixel column, and the first sensing base pattern and the second sensing base pattern are electrically connected to each other.

* * * * *